(12) United States Patent
Sugimoto et al.

(10) Patent No.: US 11,026,334 B2
(45) Date of Patent: Jun. 1, 2021

(54) WIRED CIRCUIT BOARD AND PRODUCING METHOD THEREOF

(71) Applicant: NITTO DENKO CORPORATION, Osaka (JP)

(72) Inventors: Yuu Sugimoto, Osaka (JP); Hiroyuki Tanabe, Osaka (JP); Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/860,383

(22) Filed: Apr. 28, 2020

(65) Prior Publication Data

US 2020/0260588 A1    Aug. 13, 2020

Related U.S. Application Data

(62) Division of application No. 15/478,711, filed on Apr. 4, 2017, now Pat. No. 10,687,427.

(30) Foreign Application Priority Data

Apr. 7, 2016   (JP) .................................. 2016-077551

(51) Int. Cl.
   *G11B 5/60*        (2006.01)
   *H05K 3/02*        (2006.01)
   (Continued)

(52) U.S. Cl.
   CPC .............. *H05K 3/027* (2013.01); *G11B 5/60* (2013.01); *H05K 1/0296* (2013.01); *H05K 3/108* (2013.01);
   (Continued)

(58) Field of Classification Search
   CPC ...... H05K 3/027; H05K 1/0296; H05K 3/108; H05K 3/4685; H05K 2201/09018; H05K 3/02; G11B 5/60
   (Continued)

(56) References Cited

U.S. PATENT DOCUMENTS 5,508,133 A    4/1996  Bae
5,945,740 A    8/1999  Kawazoe
(Continued)

FOREIGN PATENT DOCUMENTS

CN    103096614 A    5/2013
CN    103247302 A    8/2013
(Continued)

OTHER PUBLICATIONS

Machine Translation of Osawa et al. (Japanese Patent Publication No. 2009-129490A), Jun. 11, 2009 (Year: 2009).*
(Continued)

*Primary Examiner* — Tremesha S Willis
(74) *Attorney, Agent, or Firm* — Edwards Neils LLC; Jean C. Edwards, Esq.

(57) ABSTRACT

A method for producing a wired circuit board including an insulating layer and a conductive pattern, including (1), providing the insulating layer having an inclination face; (2), providing a metal thin film at least on the surface of the insulating layer; (3), providing a photoresist on the surface of the metal thin film; (4), disposing a photomask so that a first portion, where the conductive pattern is provided in the photoresist, is shielded from light, and the photoresist is exposed to light through the photomask; (5), removing the first portion to expose the metal thin film corresponding to the first portion; and (6), providing the conductive pattern on the surface of the metal thin film exposed from the photoresist. The inclination face has a second portion that allows (Continued)

the light reflected at the metal thin film to reach the first portion.

8 Claims, 23 Drawing Sheets

(51) Int. Cl.
  *H05K 1/02* (2006.01)
  *H05K 3/46* (2006.01)
  *H05K 3/10* (2006.01)

(52) U.S. Cl.
  CPC . *H05K 3/4685* (2013.01); *H05K 2201/09018* (2013.01); *H05K 2201/09272* (2013.01); *H05K 2201/09727* (2013.01); *H05K 2201/09781* (2013.01); *H05K 2203/0562* (2013.01)

(58) Field of Classification Search
  USPC .......................................................... 174/250
  See application file for complete search history.

(56) References Cited

U.S. PATENT DOCUMENTS

| | | | |
|---|---|---|---|
| 6,252,176 | B1 | 6/2001 | Kuramochi et al. |
| 7,250,575 | B2 | 7/2007 | Nagao et al. |
| 8,610,000 | B2 | 12/2013 | Champion |
| 8,664,535 | B2 | 3/2014 | Kamei et al. |
| 9,226,395 | B2 | 12/2015 | Ihara |
| 10,257,926 | B2 | 4/2019 | Sugimoto et al. |
| 2003/0026078 | A1 | 2/2003 | Komatsubara et al. |
| 2004/0056939 | A1 | 3/2004 | Thavarajah et al. |
| 2004/0234896 | A1 | 11/2004 | Takeo et al. |
| 2005/0122627 | A1 | 6/2005 | Kanagawa et al. |
| 2009/0114426 | A1 | 5/2009 | Tsunekawa et al. |
| 2009/0151994 | A1 | 6/2009 | Ohsawa et al. |
| 2009/0211787 | A1 | 8/2009 | Kamei et al. |
| 2013/0206458 | A1 | 8/2013 | Ihara |
| 2013/0323924 | A1 | 12/2013 | DeVilliers et al. |
| 2014/0177106 | A1 | 6/2014 | Shirafuji |
| 2015/0034369 | A1 | 2/2015 | Kashima et al. |
| 2015/0084208 | A1 | 3/2015 | Iida et al. |

FOREIGN PATENT DOCUMENTS

| | | | |
|---|---|---|---|
| JP | S62-135837 A | 6/1987 | |
| JP | H01-238039 A | 9/1989 | |
| JP | H03-035238 A | 2/1991 | |
| JP | H05-074701 A | 3/1993 | |
| JP | H06-224118 A | 8/1994 | |
| JP | H10-3632 A | 1/1998 | |
| JP | H10-041302 A | 2/1998 | |
| JP | 2004-191596 A | 7/2004 | |
| JP | 2004-348846 A | 12/2004 | |
| JP | 2009-129490 A | 6/2009 | |
| JP | 2009-206281 A | 9/2009 | |
| JP | 2012-089204 A | 5/2012 | |
| JP | 2012-104210 A | 5/2012 | |
| JP | 2012-128926 A | 7/2012 | |
| JP | 2012-155802 A | 8/2012 | |
| JP | 2013-033805 A | 2/2013 | |
| JP | 2014-127216 A | 7/2014 | |
| JP | 2015-149118 A | 8/2015 | |

OTHER PUBLICATIONS

Non-Final Office Action issued by the USPTO dated Dec. 27, 2017 in connection with U.S. Appl. No. 15/463,538.
Non-Final Office Action issued by the USPTO dated Dec. 28, 2017 in connection with U.S. Appl. No. 15/386,744.
Non-Final Office Action issued by the USPTO dated Feb. 26, 2018 in connection with U.S. Appl. No. 15/712,613.
Non-Final Office Action issued by the USPTO dated Mar. 27, 2018 in connection with U.S. Appl. No. 15/478,711.
Final Office Action issued by the USPTO dated Apr. 30, 2018, in connection with U.S. Appl. No. 15/386,744.
Final Office Action issued by the USPTO dated Jul. 23, 2018 in connection with U.S. Appl. No. 15/463,538.
Final Office Action issued by the USPTO dated Sep. 26, 2018 in connection with U.S. Appl. No. 15/478,711.
Non-Final Office Action issued by the USPTO dated Dec. 31, 2018 in connection with U.S. Appl. No. 15/605,259.
Non-Final Office Action issued by the USPTO dated Feb. 8, 2019 in connection with U.S. Appl. No. 15/478,711.
Final Office Action issued by the USPTO dated Apr. 12, 2019 in connection with U.S. Appl. No. 15/605,259.
Final Office Action issued by the USPTO dated Aug. 5, 2019 in connection with U.S. Appl. No. 15/478,711.
Notification of Reasons for Refusal issued by the Japanese Patent Office dated Jun. 18, 2019, in connection with Japanese Patent Application No. 2015-254338.
Decision of Refusal issued by the Japanese Patent Office dated Oct. 1, 2019, in connection with Japanese Patent Application No. 2015-254338.
Non-Final Office Action issued by the USPTO dated Nov. 15, 2019 in connection with U.S. Appl. No. 15/478,711.
Office Action, issued by the Japanese Patent Office dated Dec. 17, 2019, in connection with Japanese Patent Application No. 2016-077551.
Cancellation of Pre-Trial Proceedings issued by the Japanese Patent Office on Feb. 12, 2020, in connection with Japanese Patent Application No. 2015-254338.
Pre-Trial Report issued by the Japanese Patent Office on Feb. 12, 2020, in connection with Japanese Patent Application No. 2015-254338.
Office Action, issued by the Japanese Patent Office dated Feb. 25, 2020, in connection with Japanese Patent Application No. 2016-113756.
Office Action, issued by the Japanese Patent Office dated Aug. 11, 2020, in connection with Japanese Patent Application No. 2015-254338.
Office Action, issued by the State Intellectual Property Office dated Aug. 13, 2020, in connection with Chinese Patent Application No. 201710173470.1.
Office Action, issued by the State Intellectual Property Office of China dated Oct. 10, 2020, in connection with Chinese Patent Application No. 201710224810.9.
Office Action, issued by the State Intellectual Property Office dated Jun. 12, 2020, in connection with Chinese Patent Application No. 201611207609.1.

* cited by examiner

FIG.2
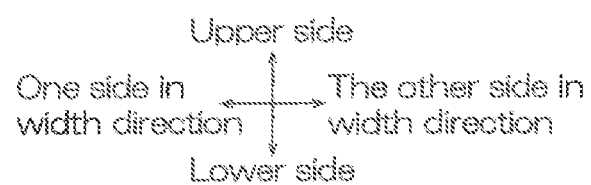
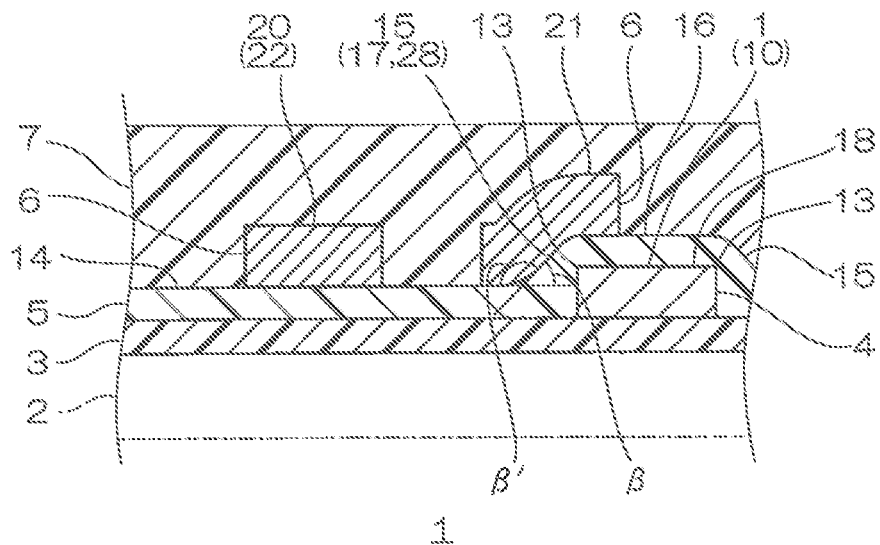

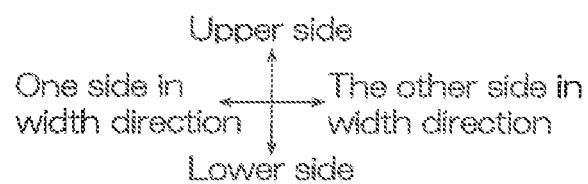
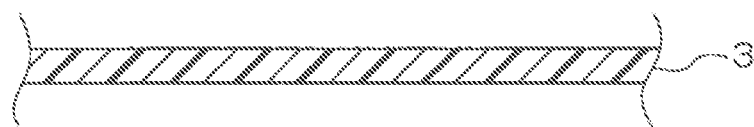
FIG.3A
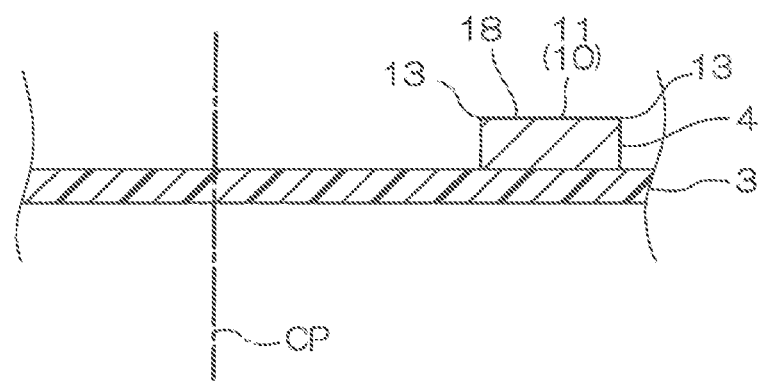
FIG.3B
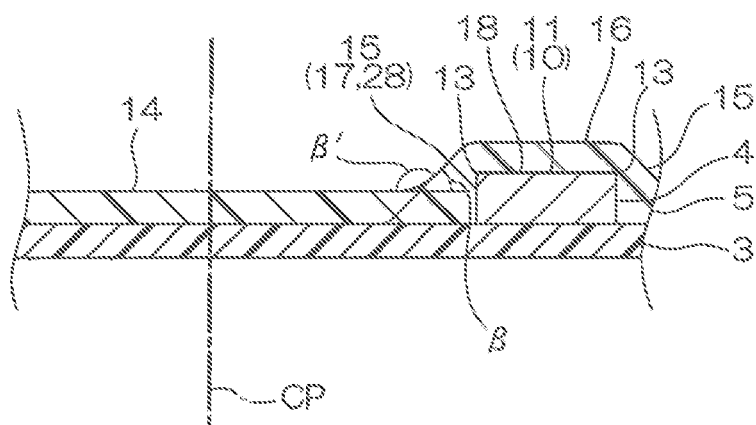
FIG.3C

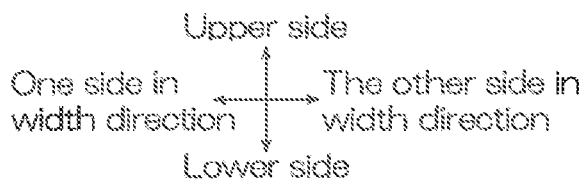
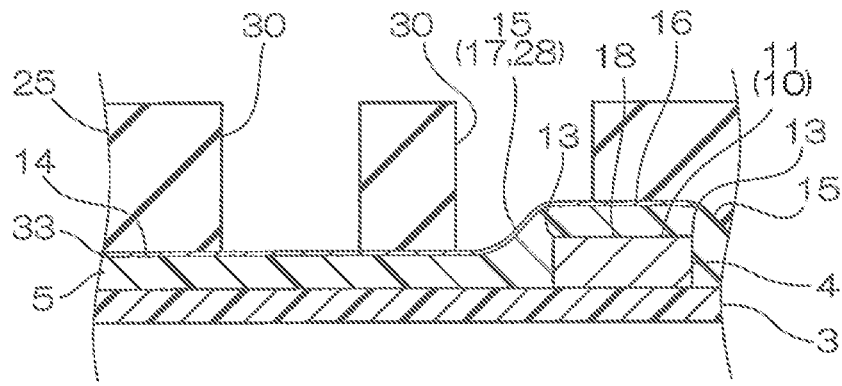
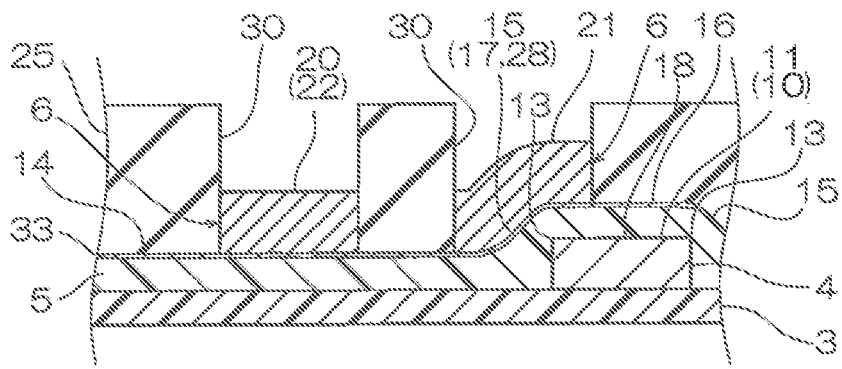
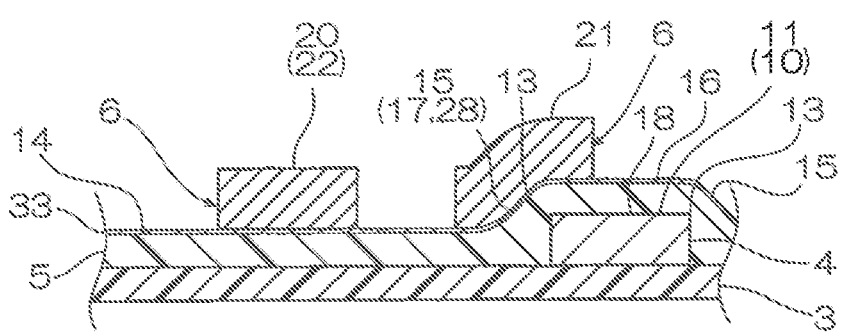

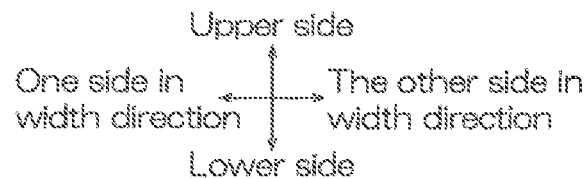
FIG.6J
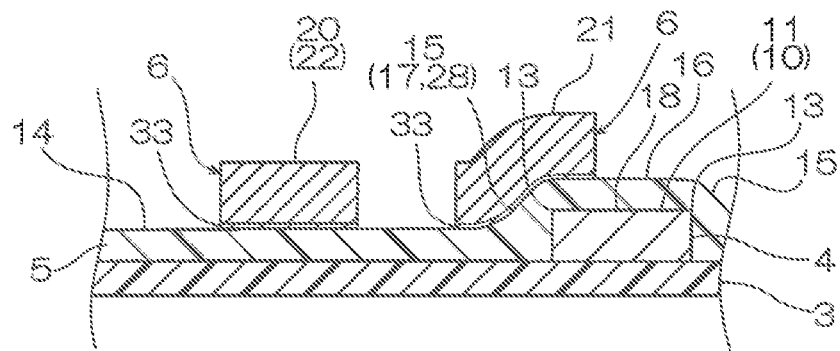
FIG.6K
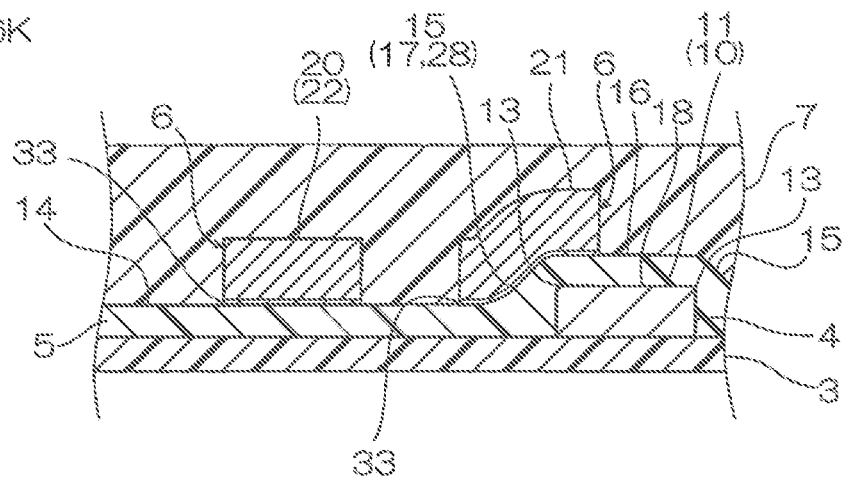

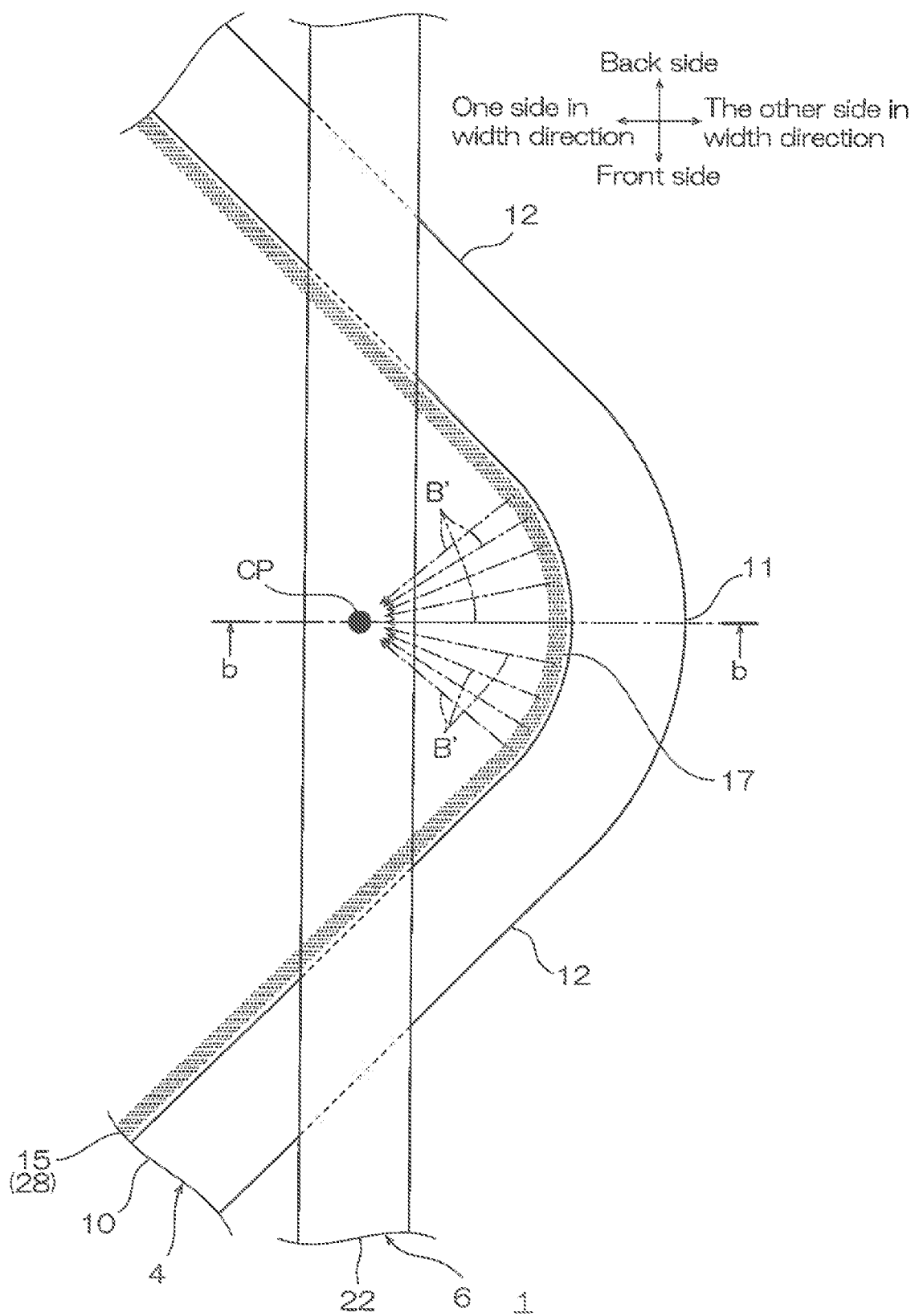

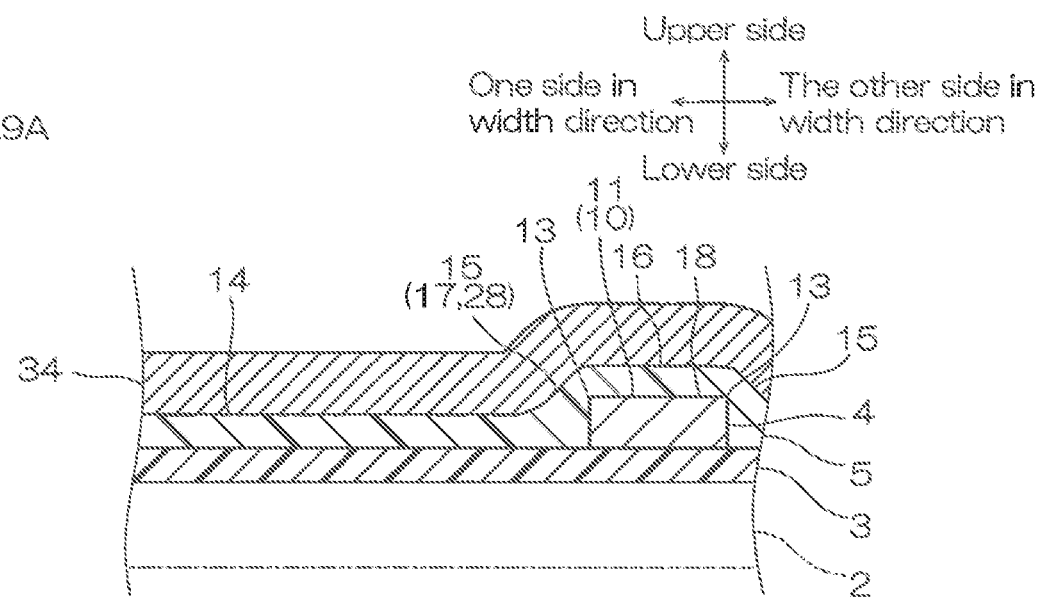
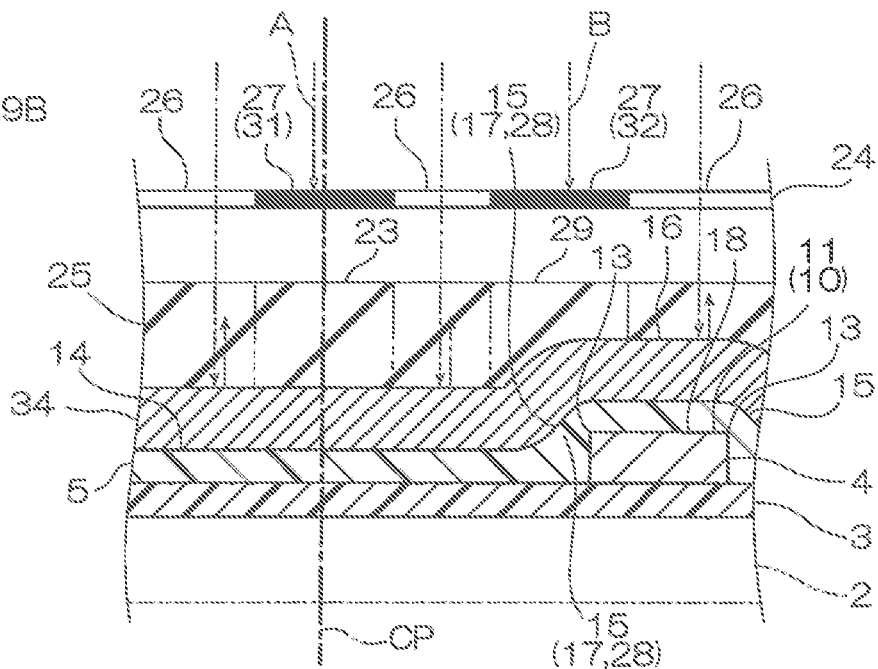
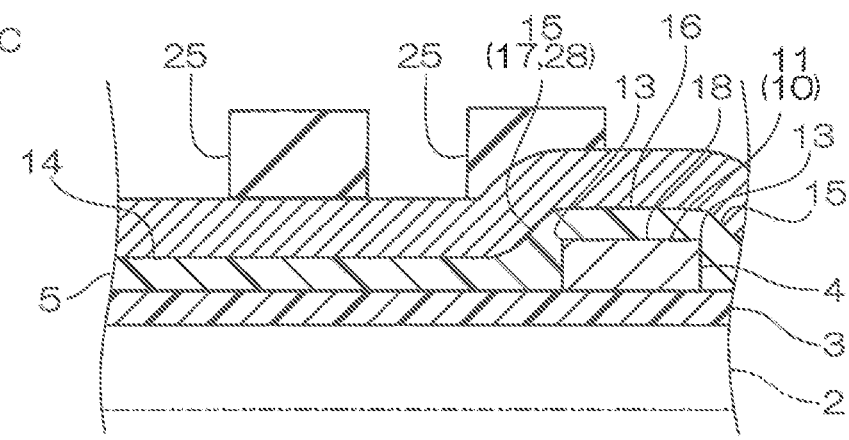

FIG.12
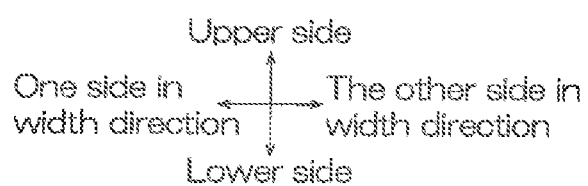
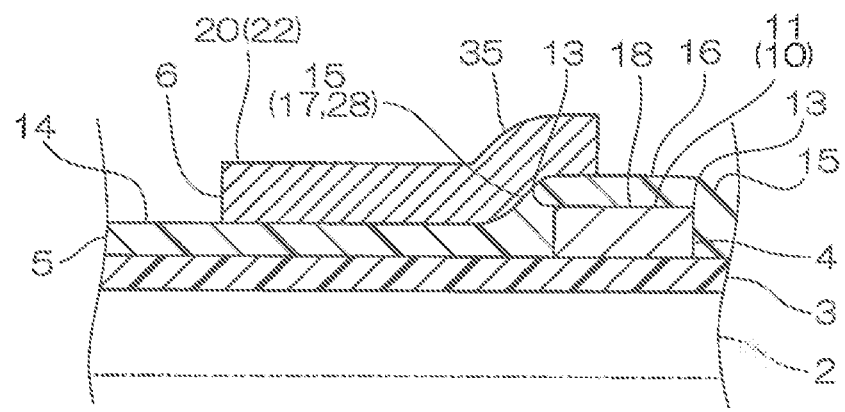

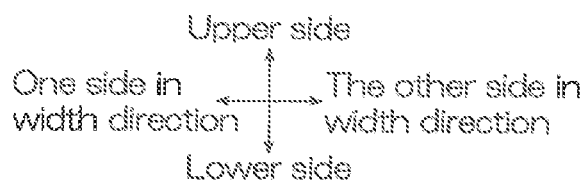
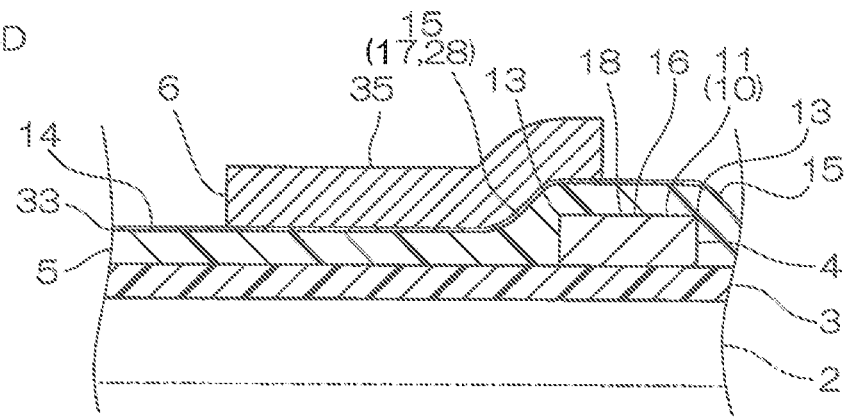
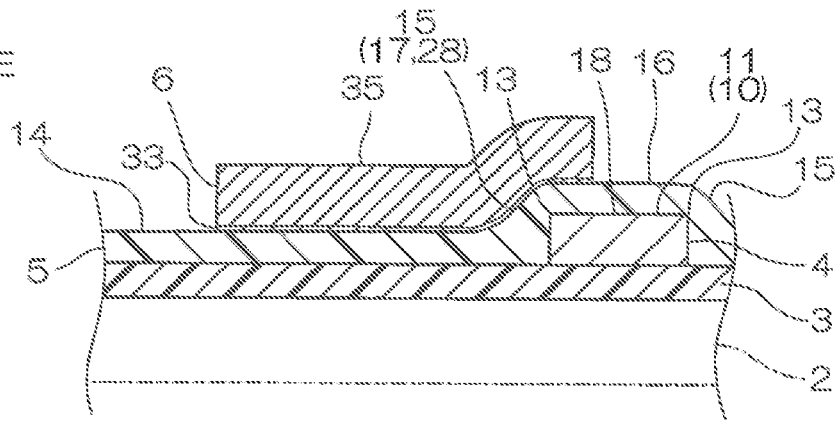
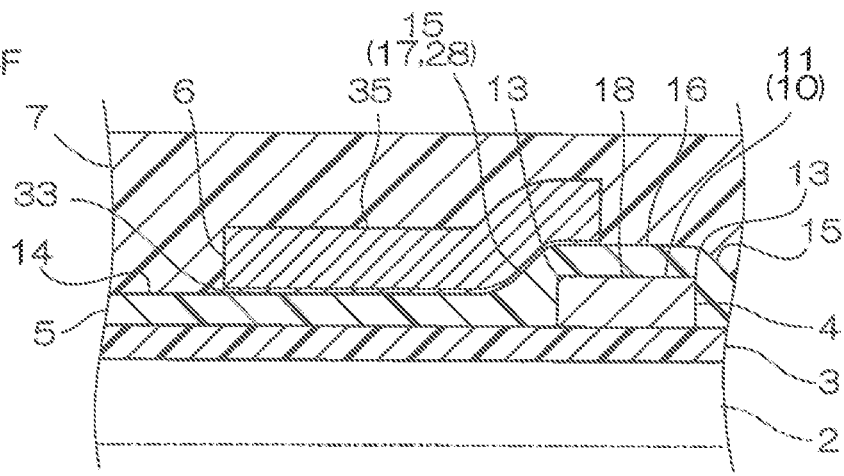

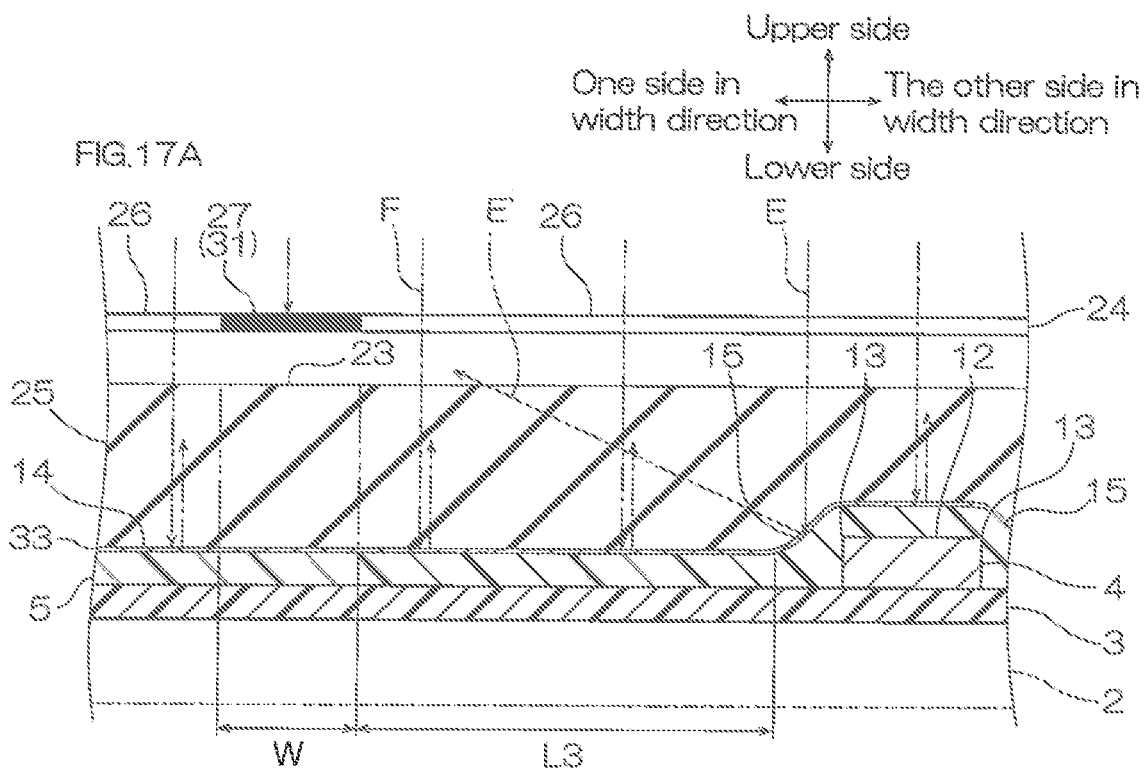
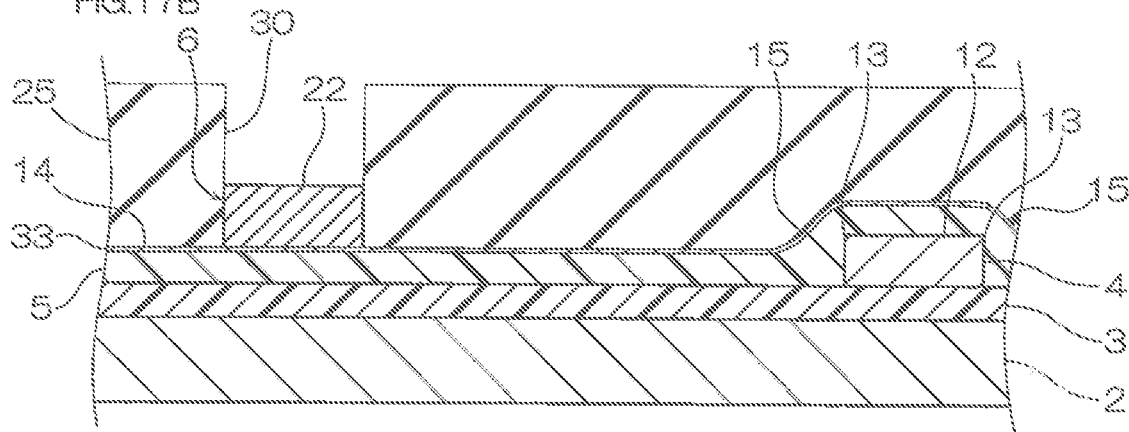
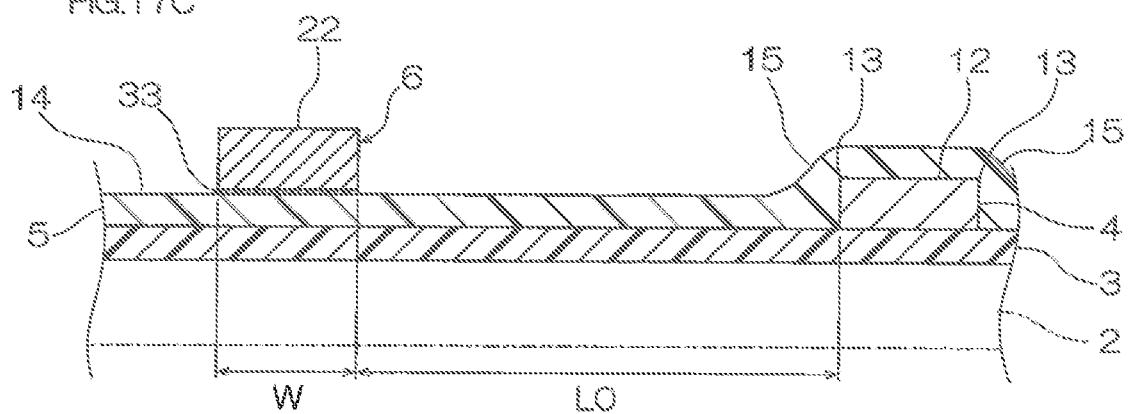

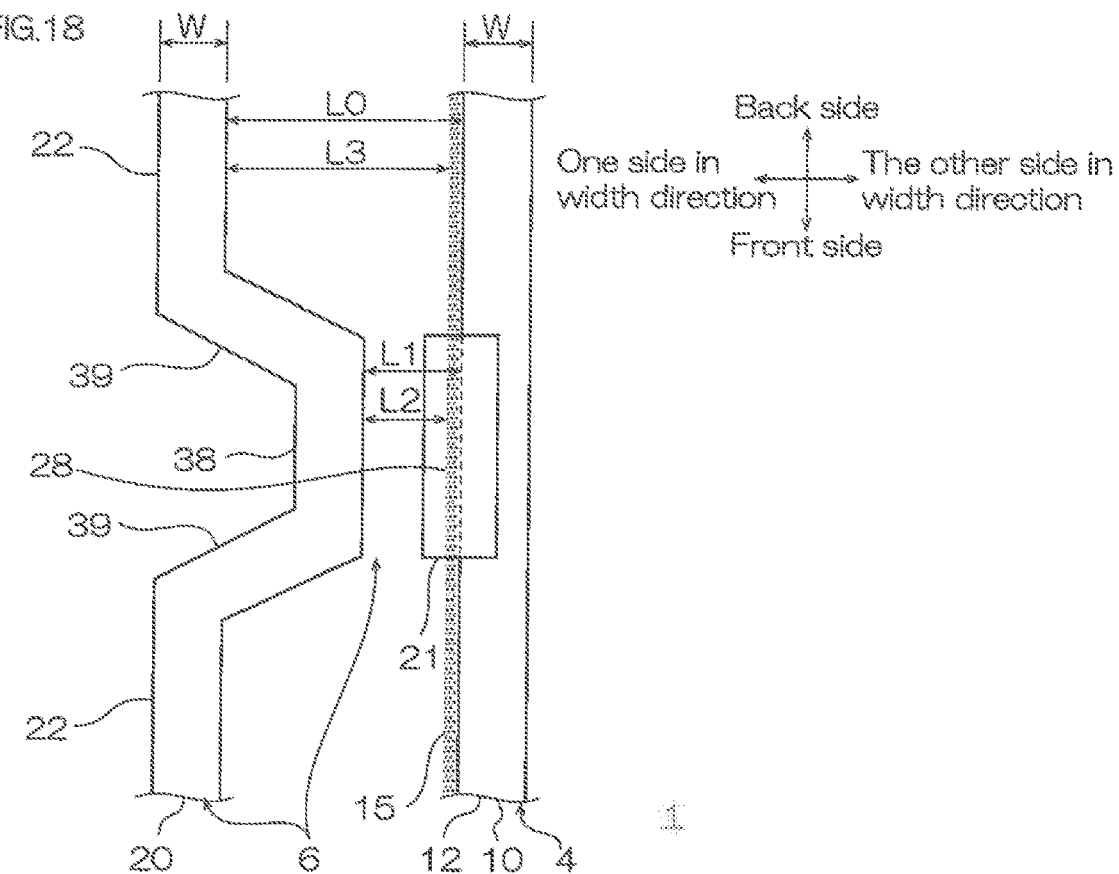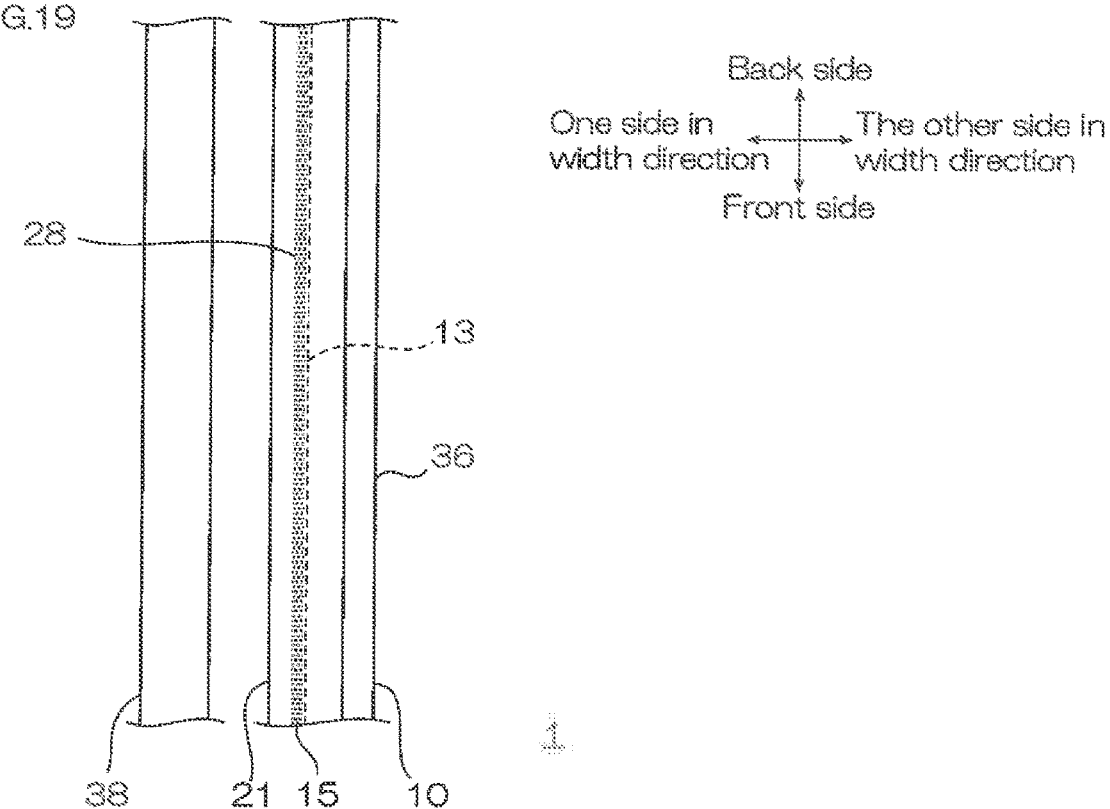

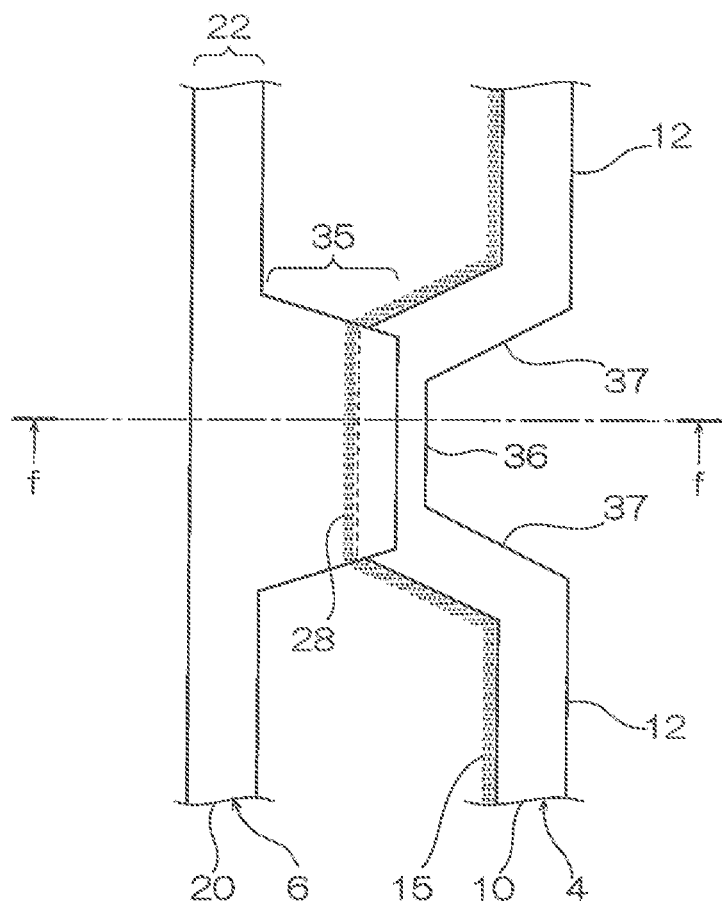

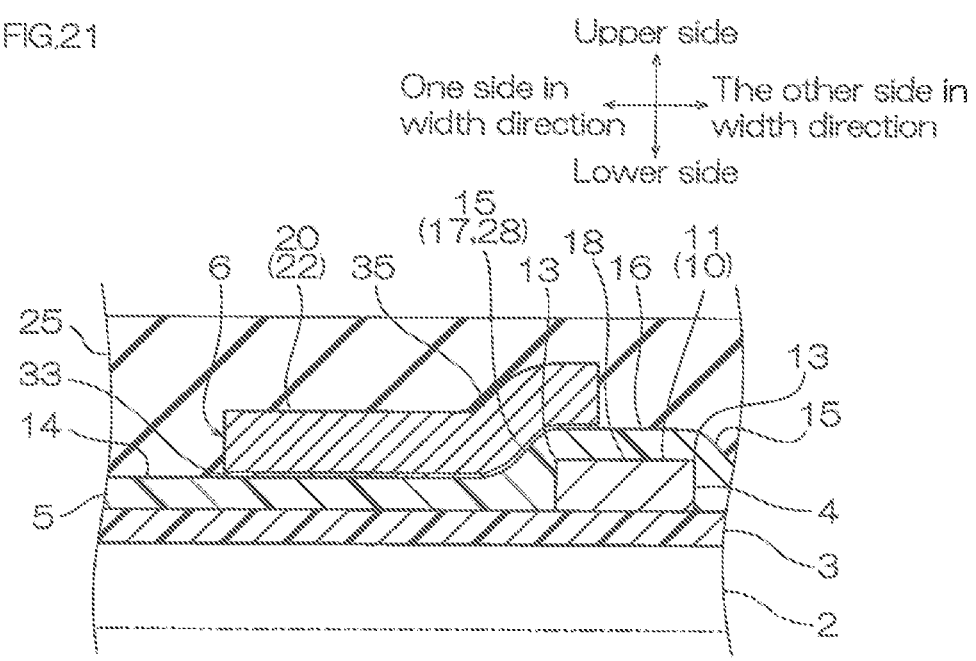

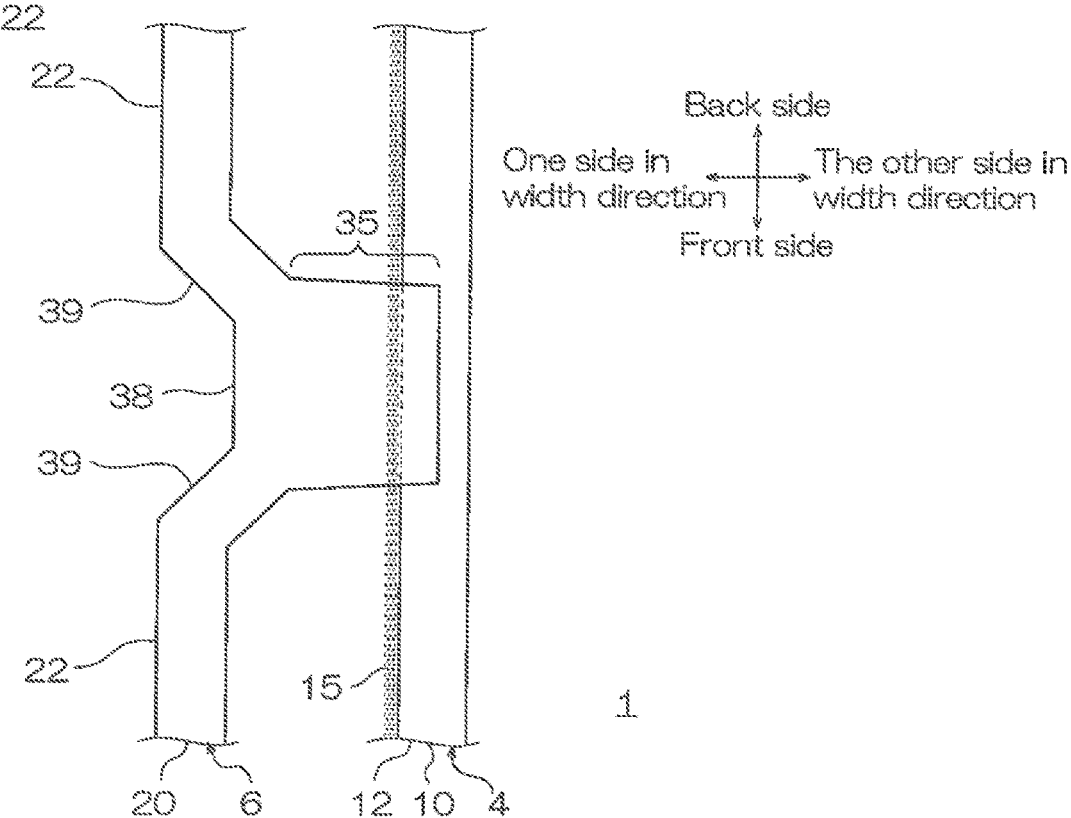
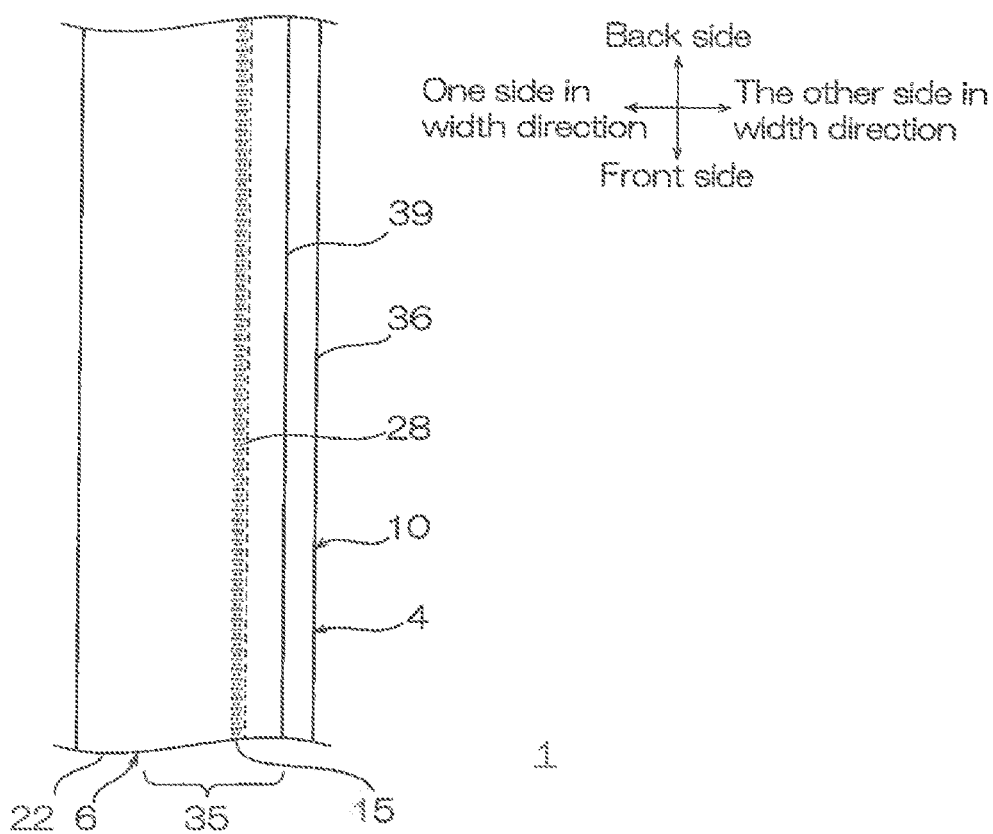

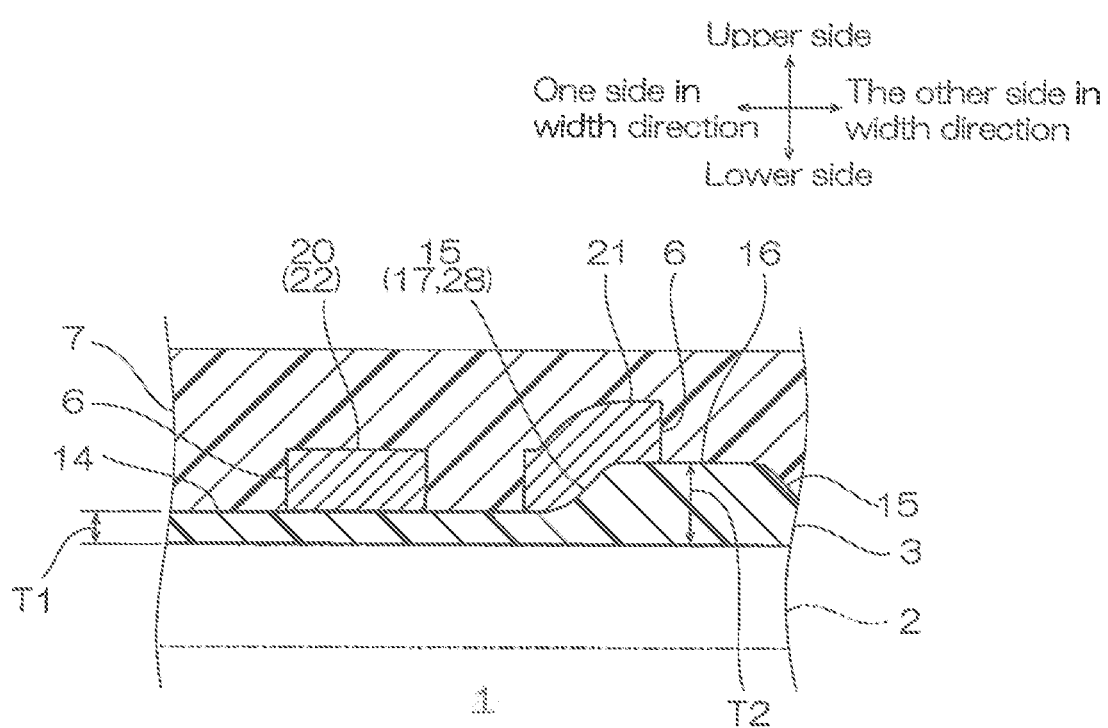

WIRED CIRCUIT BOARD AND PRODUCING METHOD THEREOF

CROSS-REFERENCE TO RELATED APPLICATION

The present application is a Divisional of U.S. patent application Ser. No. 15/478,711, filed on Apr. 4, 2017, which claims priority from Japanese Patent Application No. 2016-077551, filed on Apr. 7, 2016, the contents of which are hereby incorporated by reference into this application.

BACKGROUND OF THE INVENTION

Field of the Invention

The present invention relates to a wired circuit board and a production method thereof, in particular, to a method for producing a wired circuit board, and a wired circuit board produced by the method.

Description of Related Art

It has been known that a wired circuit board is produced by providing an insulating layer and a wiring pattern thereon.

For example, Japanese Unexamined Patent Publication No. 2014-127216 has proposed a method for producing a suspension board with circuit: the method includes a step of forming a first portion having a first thickness and a second portion having a second thickness that is smaller than the first thickness in the insulating layer, and a step of forming a wiring pattern so as to extend on the first portion and the second portion of the insulating layer.

To be specific, in the production method described in Patent Document 1, in the step of forming the wiring pattern, the wiring pattern is formed on the top face of the insulating layer so that the boundary between the top face and the boundary face of the first portion extends in a first direction, the side of the wiring pattern extends in a second direction crossing the first direction, and the second direction forms an angle of 60 degrees or more and 90 degrees or less relative to the first direction.

Because the boundary face is formed between the top face of the first portion and the top face of the second portion, in the step of forming the wiring pattern on the insulating layer by photo lithography technology, reflection of exposure light is caused at the boundary face, and the reflected light applies indirectly to other regions. However, in the method described in Patent Document 1, the exposure light is reflected in a direction that is close to the direction in which the wiring pattern extends at the boundary face, and therefore, the reflected light substantially does not affect the pattern of the original exposure light. Thus, breakage or short circuit is prevented in the wiring pattern formed by the photo lithography technology.

SUMMARY OF THE INVENTION

Recently, when producing a small-sized wired circuit board, sometimes a wiring pattern is disposed with a complicated pattern. In such a case, the wiring pattern may not be formed so as to form an angle between the second direction and the first direction to be 60 degrees or more and 90 degrees or less as in Japanese Unexamined Patent Publication No. 2014-127216. Then, there are disadvantages in that inadequate formation of the wiring pattern cannot be prevented.

The present invention provides a method for producing a wired circuit board with which deformation of the conductive pattern can be suppressed, while the conductive pattern is provided with a high degree of freedom, and a wired circuit board produced by the method.

The present invention (1) includes a method for producing a wired circuit board including an insulating layer and a conductive pattern, the method including the steps of:

a step (1), in which the insulating layer having an inclination face is provided;

a step (2), in which a metal thin film is provided at least on the surface of the insulating layer;

a step (3), in which a photoresist is provided on the surface of the metal thin film;

a step (4), in which a photomask is disposed so that a first portion, where the conductive pattern is to be provided in the photoresist, is shielded from light, and the photoresist is exposed to light through the photomask;

a step (5), in which the first portion is removed to expose the metal thin film corresponding to the first portion; and a step (6), in which the conductive pattern is provided on the surface of the metal thin film exposed from the photoresist, wherein the inclination face has a second portion that allows the reflected light reflected at the metal thin film to reach the first portion, and in the step (4), the photomask is disposed so that the photoresist facing the second portion is shielded from light.

With the method, in the step (4), the photomask is disposed so that the photoresist facing the second portion is shielded from light. Therefore, even when the inclination face has the second portion that allows the reflected light reflected at the metal thin film to reach the first portion, the above-described reflected light can be prevented from reaching the first portion. Thus, in the step (4), the first portion is surely shielded from light and the photoresist can be exposed to light; in the step (5), the metal thin film corresponding to the first portion is surely exposed; and subsequently, in the step (6), the conductive pattern in which deformation is suppressed can be surely provided.

Therefore, a conductive pattern having high reliability can be provided with a high degree of freedom.

As a result, a wired circuit board having a high degree of freedom with excellent connection reliability can be produced.

The present invention (2) includes a method for producing a wired circuit board including an insulating layer and a conductive pattern, the method including the steps of:

a step (1), in which the insulating layer having an inclination face is provided;

a step (2), in which a conductive layer is provided at least on the surface of the insulating layer;

a step (3), in which a photoresist is provided on the surface of the conductive layer;

a step (4), in which a photomask is disposed so that a first portion, where the conductive pattern is to be provided in the photoresist, is shielded from light, and the photoresist is exposed to light through the photomask;

a step (5), in which the photoresist other than the first portion is removed so as to leave the first portion; and a step (6), in which the conductive layer exposed from the first portion is removed to form the conductive pattern;

wherein the inclination face has a second portion that allows the reflected light reflected at the conductive layer to reach the first portion, and in the step (4), the photomask is disposed so that the photoresist facing the second portion is shielded from light.

With the method, in the step (4), the photomask is disposed so that the photoresist facing the second portion is shielded from light. Therefore, even when the inclination face has the second portion that allows the reflected light reflected at the conductive layer to reach the first portion, the above-described reflected light can be prevented from reaching the first portion. Thus, in the step (4), the first portion is surely shielded from light and the photoresist can be exposed to light; in the step (5), the photoresist other than the first portion is surely removed so as to leave the first portion; and subsequently, in the step (6), the conductive pattern in which deformation is suppressed can be surely provided.

Therefore, a conductive pattern having high reliability can be provided with a high degree of freedom.

As a result, a wired circuit board having a high degree of freedom with excellent connection reliability can be produced.

The present invention (3) includes the method for producing a wired circuit board described in the above-described (1) or (2), wherein the second portion has a bent portion bending in one direction when viewed from the top, and the bent portion is made so that the reflected light corresponding to the bent portion is focused on the first portion.

When the second portion has the bent portion bending in one direction when viewed from the top, and the bent portion is made so that the reflected light corresponding to the bent portion is focused on the first portion, in the step (4), the reflected light corresponding to the bent portion is focused on the first portion, so that the first portion cannot be shielded from light; in the step (5), the metal thin film corresponding to the first portion cannot be exposed; and in the step (6), the conductive pattern having deformation is provided.

However, with the method, in the step (4), the photomask is disposed so that the photoresist facing the second portion is shielded from light, and thus, in the step (4), the reflected light is prevented from being focused on the first portion and the first portion can be surely shielded from light; in the step (5), the metal thin film corresponding to the first portion is surely exposed; and subsequently, in the step (6), the conductive pattern in which deformation is suppressed can be surely provided.

The present invention (4) includes the method for producing a wired circuit board described in any one of the above-described (1) to (3), wherein the conductive pattern has a wire having a width W of 15 μm or less, the first portion corresponding to the wire is disposed at an interval L of 20 μm or less relative to the second portion when viewed from the top, and the width W (μm) and the interval L (μm) satisfy the following formula (1):

$$L \leq -2 \times W + 35 \tag{1}$$

When the conductive pattern has the wire having the narrow width W of 15 μm or less, the second portion is disposed at the predetermined interval L relative to the wire when viewed from the top, and the above-described formula (1) is satisfied, in the step (4), the reflected light corresponding to the second portion easily reaches the first portion. Thus, the first portion cannot be shielded from light; in the step (5), the metal thin film corresponding to the first portion cannot be exposed; and in the step (6), the conductive pattern having deformation is provided.

However, with the method, in the step (4), the photomask is disposed so that the photoresist facing the second portion is shielded from light, and thus, in the step (4), the first portion is surely shielded from light and the photoresist can be exposed to light; in the step (5), the metal thin film corresponding to the first portion is surely exposed; and subsequently, in the step (6), the wire in which deformation is suppressed can be surely provided.

The present invention (5) includes the method for producing a wired circuit board described in any one of the above-described (1) to (4), wherein the conductive pattern has a wire and a dummy wire provided independently from the wire, and in the step (4), a third portion, where the dummy wire is to be provided in the photoresist, is overlapped with the second portion when viewed from the top.

With the method, in the step (4), the third portion, where the dummy wire is to be provided in the photoresist, is overlapped with the second portion when viewed from the top, so that in the step (4), the third portion can be surely shielded from light. Therefore, the occurrence of the reflected light in the second portion that is overlapped with the third portion can be prevented. Thus, the exposure to light of the first portion caused by the reflected light in the second portion is surely prevented, and the wire can be surely provided.

The present invention (6) includes the method for producing a wired circuit board described in any one of the above-described (1) to (5), wherein the conductive pattern has a wire and a dummy portion provided continuously from the wire, and in the step (4), a third portion, where the dummy portion is to be provided in the photoresist, is overlapped with the second portion when viewed from the top.

With the method, in the step (4), the third portion, where the dummy portion is to be provided in the photoresist, is overlapped with the second portion when viewed from the top, so that in the step (4), the third portion can be surely shielded from light. Therefore, the occurrence of the reflected light in the second portion that is overlapped with the third portion can be prevented. As a result, the exposure to light of the first portion caused by the reflected light in the second portion is surely prevented, and the wire can be surely provided.

The present invention (7) includes a wired circuit board including an insulating layer having an inclination face and a conductive pattern having a wire and a dummy wire provided independently from the wire, wherein the inclination face has a bent portion bending in one direction when viewed from the top, and the dummy wire is overlapped with the bent portion when viewed from the top.

In the wired circuit board, when the inclination face has the bent portion bending in one direction when viewed from the top, in photo processing of the production step of the wired circuit board, a light shielding failure occurs in the portion corresponding to the wire caused by the unintended reflection corresponding to the bent portion, and as a result, the reliability of the wire is decreased.

However, in the wired circuit board, the conductive pattern has the dummy wire and the dummy wire is overlapped with the bent portion when viewed from the top, so that in photo processing of the production step of the wired circuit board, by preventing the unintended reflection corresponding to the bent portion, the occurrence of the light shielding failure in the portion corresponding to the wire can be prevented. Therefore, the reliability of the wire is improved.

The present invention (8) includes a wired circuit board including an insulating layer having an inclination face and a conductive pattern having a wire and a dummy portion provided continuously from the wire, wherein the inclination face has a bent portion bending in one direction when viewed from the top, and the dummy portion is overlapped with the bent portion when viewed from the top.

In the wired circuit board, when the inclination face has the bent portion bending in one direction when viewed from the top, in photo processing of the production step of the wired circuit board, a light shielding failure occurs in the portion corresponding to the wire caused by the unintended reflection corresponding to the bent portion, and as a result, the reliability of the wire is decreased.

However, in the wired circuit board, the conductive pattern has the dummy portion and the dummy portion is overlapped with the bent portion when viewed from the top, so that in photo processing of the production step of the wired circuit board, by preventing the unintended reflection corresponding to the bent portion, the occurrence of the light shielding failure in the portion corresponding to the wire can be prevented. Therefore, the reliability of the wire is improved.

The present invention (9) includes a wired circuit board including an insulating layer having an inclination face and a conductive pattern having a wire having a width W of 15 μm or less and a dummy wire provided independently from the wire, wherein the inclination face has a second portion disposed at an interval L of 20 μm or less relative to the wire when viewed from the top, the width W (μm) and the interval L (μm) satisfy the following formula (1), and the dummy wire is overlapped with the wire when viewed from the top:

$$L \leq -2 \times W + 35 \quad (1)$$

When in the wired circuit board, the wire having the narrow width of 15 μm or less is included, the inclination face has the second portion disposed at the predetermined interval relative to the wire when viewed from the top, and the above-described formula (1) is satisfied, in photo processing of the production step of the wired circuit board, a light shielding failure easily occurs in the portion corresponding to the wire caused by the unintended reflection corresponding to the inclination face, and the reliability of the wire is decreased.

However, in the wired circuit board, the conductive pattern has the dummy wire and the dummy wire is overlapped with the wire when viewed from the top, so that in photo processing of the production step of the wired circuit board, by preventing the unintended reflection corresponding to the bent portion, the occurrence of the light shielding failure in the portion corresponding to the wire can be prevented. Therefore, the reliability of the wire is improved.

The present invention (10) includes a wired circuit board including an insulating layer having an inclination face and a conductive pattern having a wire having a width W of 15 μm or less and a dummy portion provided continuously from the wire, wherein the conductive pattern has a second portion disposed at an interval L of 20 μm or less relative to the wire when viewed from the top, the width W (μm) and the interval L (μm) satisfy the following formula (1), and the dummy portion is overlapped with the wire when viewed from the top:

$$L \leq -2 \times W + 35 \quad (1)$$

When in the wired circuit board, the wire having the narrow width of 15 μm or less is included, the inclination face has the second portion disposed at the predetermined interval relative to the wire when viewed from the top, and the above-described formula (1) is satisfied, in photo processing of the production step of the wired circuit board, a light shielding failure easily occurs in the portion corresponding to the wire caused by the unintended reflection corresponding to the inclination face, and the reliability of the wire is decreased.

However, in the wired circuit board, the conductive pattern has the dummy portion and the dummy portion is overlapped with the wire when viewed from the top, so that in photo processing of the production step of the wired circuit board, by preventing the unintended reflection corresponding to the bent portion, the occurrence of the light shielding failure in the portion corresponding to the wire can be prevented. Therefore, the reliability of the wire is improved.

With the method for producing a wired circuit board of the present invention, a wired circuit board having a high degree of freedom with excellent connection reliability can be produced.

In the wired circuit board of the present invention, the reliability of the wire is improved.

BRIEF DESCRIPTION OF THE DRAWINGS

FIG. 2 shows a cross-sectional view along line a-a of the wired circuit board shown in FIG. 1.

FIG. 3A to FIG. 3C show a first embodiment of the method for producing a wired circuit board of the present invention, illustrating process diagrams of the method for producing a wired circuit board shown in FIG. 2:

FIG. 3A illustrating a step (i), in which an insulating base layer is prepared,

FIG. 3B illustrating a step (ii), in which a first conductive pattern is provided, and FIG. 3C illustrating a step (1), in which an intermediate insulating layer is provided.

FIG. 4D illustrating a step (2), in which a metal thin film is provided,

FIG. 4E illustrating a step (3), in which a photoresist is provided, and

FIG. 4F illustrating a step (4), in which the photoresist is exposed to light.

FIG. 5G to FIG. 5I show, following FIG. 4F, the first embodiment of the method for producing a wired circuit board of the present invention, illustrating process diagrams of the first embodiment of the method for producing a wired circuit board:

FIG. 5G illustrating a step (4), in which a first portion and a third portion of the photoresist are removed, FIG. 5H illustrating a step (5), in which a second conductive pattern is provided, and FIG. 5I illustrating a step (iii), in which the photoresist is removed.

FIG. 6J and FIG. 6K show, following FIG. 5I, the first embodiment of the method for producing a wired circuit board of the present invention, illustrating process diagrams of the first embodiment of the method for producing a wired circuit board:

FIG. 6J illustrating a step (iv), in which the metal thin film corresponding to the photoresist is removed, and FIG. 6K illustrating a step (v), in which an insulating cover layer is provided.

FIG. 7 shows a plan view of a wired circuit board of prior art (Comparative Example).

FIG. 8A illustrating a step (4), in which a photoresist is exposed to light,

FIG. 8B illustrating a step (5), in which a first portion of the photoresist is removed, and FIG. 8C illustrating a step (6), in which a second conductive pattern is provided.

FIG. 9A to FIG. 9C are process diagrams illustrating a second embodiment of the method for producing a wired circuit board of the present invention:

FIG. 9A illustrating a step (2), in which a conductive layer is provided,

FIG. 9B illustrating a step (3), in which a photoresist is provided, a photomask is disposed, and the photoresist is exposed to light, and FIG. 9C illustrating a step (4), in which a first portion and a third portion in the photoresist are removed.

FIG. 10D illustrating a step (5), in which the conductive layer exposed from the photoresist is removed to form a second conductive pattern, FIG. 10E illustrating a step of removing the photoresist, and FIG. 10F illustrating a step (v), in which an insulating cover layer is provided.

FIG. 12 shows a cross-sectional view along line c-c of the wired circuit board shown in FIG. 11.

FIG. 13A illustrating a step (4), in which a photoresist is exposed to light,

FIG. 13B illustrating a step (4), in which a first portion and a third portion of the photoresist are collectively removed, and FIG. 13C illustrating a step (5), in which a second conductive pattern is provided.

FIG. 14D to FIG. 14F show, following FIG. 13C, the third embodiment of the method for producing a wired circuit board of the present invention, illustrating process diagrams of the method for producing a wired circuit board shown in FIG. 12:

FIG. 14D illustrating a step of removing the photoresist,

FIG. 14E illustrating a step (iv), in which a metal thin film corresponding to the photoresist is removed, and FIG. 14F illustrating a step (v), in which an insulating cover layer is provided.

FIG. 16A illustrating a step (4), in which a photoresist is exposed to light,

FIG. 16B illustrating a step (4), in which a first portion and a third portion in the photoresist are removed, and FIG. 16C illustrating a step (5), in which the photoresist and a metal thin film corresponding to the photoresist are removed.

FIG. 17A to FIG. 17C are process diagrams illustrating production of the wired circuit board shown in FIG. 15 and show cross-sectional views along line e-e of the wired circuit board shown in FIG. 1:

FIG. 17A illustrating a step (4), in which the photoresist is exposed to light,

FIG. 17B illustrating a step (4), in which the first portion of the photoresist is removed, and FIG. 17C illustrating a step (5), in which the photoresist and the metal thin film corresponding to the photoresist are removed.

FIG. 18 shows a plan view of a modified example (embodiment in which a second wire has a fourth linear portion) of the fourth embodiment.

FIG. 19 shows a plan view of a modified example (embodiment in which a first wire consists of only a third linear portion and the second wire consists of only the fourth linear portion) of the fourth embodiment.

FIG. 20 shows a plan view of the wired circuit board in a fifth embodiment of the present invention.

FIG. 21 shows a cross-sectional view along line f-f of the wired circuit board shown in FIG. 20.

FIG. 22 shows a plan view of a modified example (embodiment in which a second wire has a fourth linear portion) of the fifth embodiment.

FIG. 23 shows a plan view of a modified example (embodiment in which a first wire consists of only a third linear portion and the second wire consists of only the fourth linear portion) of the fifth embodiment.

FIG. 24 shows a cross-sectional view of a modified example (embodiment in which the first conductive pattern and the intermediate insulating layer are not provided) of the first embodiment.

DETAILED DESCRIPTION OF THE INVENTION

Figure 1:
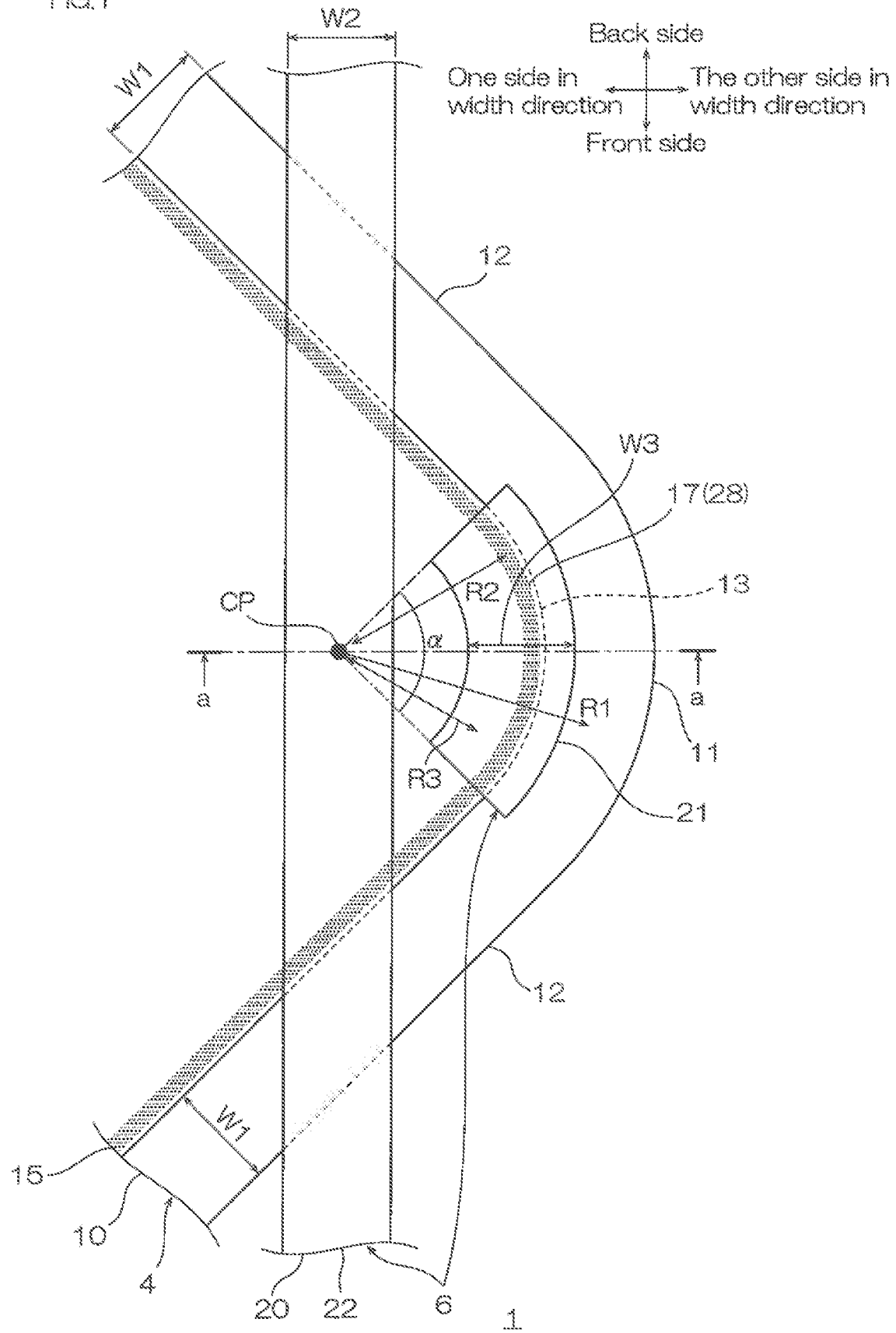
FIG. 1 shows a plan view of the wired circuit board of the present invention in a first embodiment.

In FIG. 1, up-down direction in the plane of the paper is front-back direction (first direction), lower side is front side (one side in the first direction), and upper side in the plane of the paper is back side (the other side in the first direction).

In FIG. 1, left-right direction in the plane of the paper is width direction (second direction perpendicular to the first direction), left side in the plane of the paper is one side in the width direction (one side in the second direction), and right side in the plane of the paper is the other side in the width direction (the other side in the second direction).

In FIG. 1, paper thickness direction in the plane of the paper is up-down direction (third direction perpendicular to the first direction and the second direction, thickness direction), near side in the plane of the paper is upper side (one side in the third direction, one side in the thickness direction), and further side in the plane of the paper is lower side (the other side in the third direction, the other side in the thickness direction). The directions are, to be specific, in accordance with the direction arrows in the figures.

In FIG. 1, FIG. 7, FIG. 11, FIG. 15, FIG. 18 to FIG. 20, FIG. 22, and FIG. 23, to clearly show the relative positions of a first conductive pattern 4 and a second conductive pattern 6 described later, an insulating base layer 3, an intermediate insulating layer 5, and an insulating cover layer 7 described later are omitted. However, only a bent portion 17 (inclination face 15 at one side in the width direction) of the intermediate insulating layer 5 is shown in dotted hatching.

First Embodiment

The wired circuit board of the present invention has a single layer or a plurality of layers of the conductive pattern, and its layer structure is not particularly limited. The wired circuit board includes a suspension board with circuit including a metal supporting board, and a flexible wired circuit board including no metal supporting board.

In the following, a first embodiment of the wired circuit board and its production method of the present invention are described sequentially.

1. Wired Circuit Board

As shown in FIGS. 1 and 2, a wired circuit board 1 includes the insulating base layer 3, the first conductive pattern 4 provided on the insulating base layer 3, the intermediate insulating layer 5 provided on the insulating base layer 3 and covering the first conductive pattern 4 as an example of the insulating layer, the second conductive pattern 6 disposed on the intermediate insulating layer 5 as an example of the conductive pattern, and the insulating cover layer 7 provided on the intermediate insulating layer 5 and covering the second conductive pattern 6.

The insulating base layer 3 has a generally flat plate (sheet) shape extending in the front-back direction. The insulating base layer 3 is made of an insulating material. Examples of the insulating material include synthetic resins such as polyimide resin, polyamide-imide resin, acrylic resin, polyether resin, nitrile resin, polyether sulfone resin, polyethylene terephthalate resin, polyethylenenaphthalate resin, and polyvinyl chloride resin, and preferably, polyimide resin is used. The insulating base layer 3 has a thickness of, for example, 1 μm or more, preferably 3 μm or more, and for example, 25 μm or less, preferably 15 μm or less.

The first conductive pattern 4 integrally includes a first wire 10, and a first terminal (not shown) provided at both ends of the first wire 10.

The first wire 10 integrally includes a first arc portion 11 having an arc shape, and two first linear portions 12 continued from both ends of the first arc portion 11.

The first arc portion 11 is bent toward one side in the width direction as it approaches the back side.

The virtual circle (to be specific, virtual circle along the center in the width direction of the first arc portion 11) along the first arc portion 11 has a radius R1 of, for example, 5 μm or more, preferably 15 μm or more, and for example, 300 μm or less, preferably 100 μm or less.

The central angle α of the first arc portion 11 is not particularly limited, and for example, more than 0 degree, preferably 30 degrees or more, more preferably 45 degrees or more, and for example, 180 degrees or less, preferably 90 degrees or less.

The two first linear portions 12 are disposed so that their extension lines cross. Of the two first linear portions 12, one inclines from the front end portion of the first arc portion 11 toward obliquely and forwardly one side in the width direction when viewed from the top, and the other inclines from the back end portion of the first arc portion 11 toward obliquely and backwardly one side in the width direction when viewed from the top.

The first wire 10 (first arc portion 11 and first linear portion 12) has a generally rectangular shape when viewed in cross section. The first wire 10 has two ridgeline portions 13 at the upper end portion.

The first conductive pattern 4 has a thickness of, for example, 1 μm or more, preferably 3 μm or more, and for example, 20 μm or less, preferably 12 μm or less. A width W1 of the first wire 10 is not particularly limited, to be specific, for example, 5 μm or more, preferably 8 μm or more, and for example, 200 μm or less, preferably 100 μm or less.

The intermediate insulating layer 5 is disposed at the top face of the insulating base layer 3 so as to cover the side face and a top face 16 of the first conductive pattern 4. Although not shown, the intermediate insulating layer 5 allows the first terminal (not shown) of the first conductive pattern 4 to expose. The intermediate insulating layer 5 has a top face including a first flat face 14, the inclination face 15, and a second flat face 16.

The first flat face 14 is a face parallel to a surface direction (direction along the surface of the insulating base layer 3), and is a face facing the top face of the insulating base layer 3 exposed from the first conductive pattern 4 in the thickness direction.

The inclination face 15 corresponds to the first wire 10, continues from the first flat face 14, and is a face inclined relative to the surface direction. To be specific, the inclination face 15 is a face that inclines (elevates) upward from the first flat face 14 in correspondence with the two ridgeline portions 13 of the first wire 10.

The supplementary angle β to the angle β' formed with the inclination face 15 and the first flat face 14, that is, the gradient β of the inclination face 15 relative to the first flat face 14 is not particularly limited, and for example, the gradient β is 5 degrees or more, preferably 20 degrees or more, and for example, less than 90 degrees, preferably 60 degrees or less.

Figure 8A:
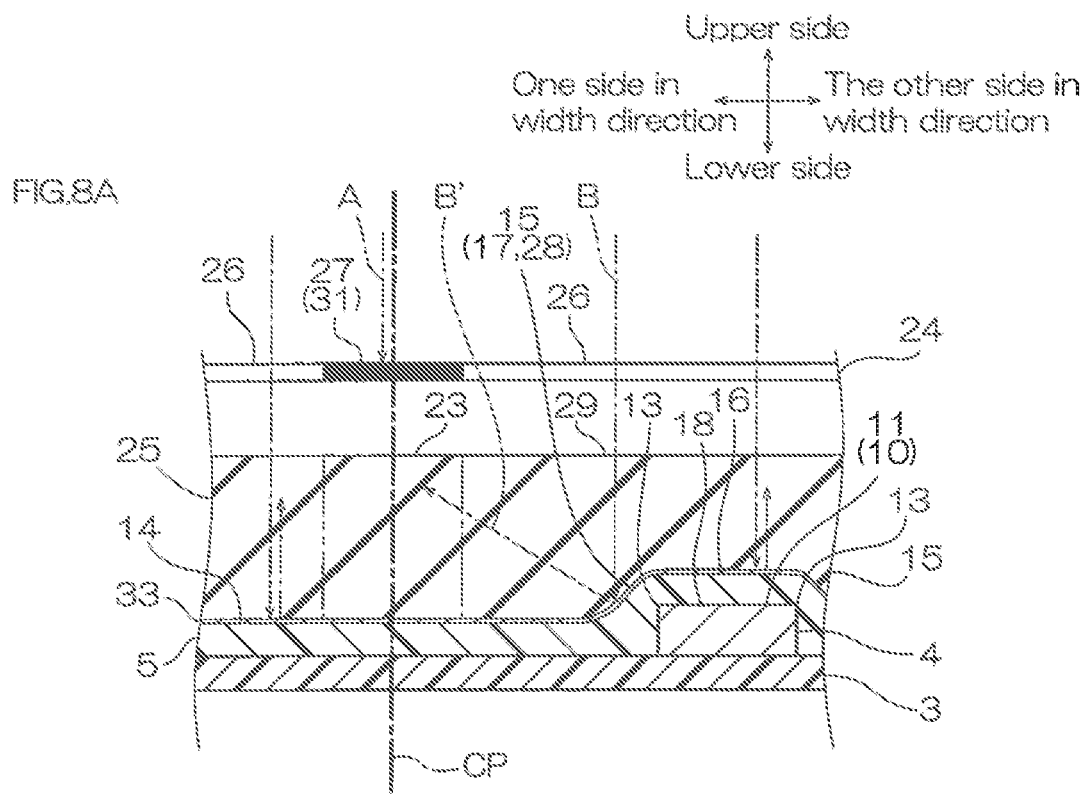
FIG. 8A to FIG. 8C are process diagrams illustrating the method for producing a wired circuit board shown in FIG. 7 and cross-sectional views along line b-b.

The inclination face 15 has, although described later, as shown in FIG. 7 and FIG. 8A, a second portion 28 that allows a reflected light B' at a metal thin film 33 to reach a first portion 23 in a photoresist 25.

As shown in FIG. 1 and FIG. 2, the second portion 28 consists of the bent portion 17 as an example of the bent portion. To be specific, the second portion 28 preferably consists of only the bent portion 17.

To be specific, the bent portion 17 is a portion at one side in the width direction (inner side portion) of the two inclination faces 15 corresponding to the two ridgeline portions 13. The bent portion 17 has an arc shape similar to the arc shape of the ridgeline portion 13 when viewed from the top. The bent portion 17 is continuously bent toward one side in the width direction. The virtual circle along the bent portion 17 (to be specific, virtual circle along the center in the width direction of the bent portion 17) has a radius R2 of, for example, 5 μm or more, preferably 15 μm or more, and for example, 300 μm or less, preferably 100 μm or less.

The second flat face 16 corresponds to a top face 18 that connects the two ridgeline portions 13 of the first wire 10, and is disposed to face above the top face 18 in spaced-apart relation. The second flat face 16 connects the upper end portion of the two inclination faces 15. The second flat face 16 is parallel with the first flat face 14.

The second conductive pattern 6 integrally includes a second wire 20 as an example of the wire, and a second terminal (not shown) provided at both ends of the second wire 20. The second conductive pattern 6 further has a dummy wire 21 provided independently from the second wire 20.

The second wire 20 consists of a second linear portion 22 extending in the front-back direction. The second linear portion 22 crosses the two first linear portions 12 when projected in the thickness direction. The second linear portion 22 is overlapped with a center CP of the arc of the bent portion 17 when projected in the thickness direction. To be specific, the central portion in the width direction of the second linear portion 22 is overlapped with the center CP of the arc of the bent portion 17 in the thickness direction. The second wire 20 is disposed at the top face of the first flat face 14 of the intermediate insulating layer 5. The second wire 20 has a generally rectangular shape when viewed in cross section.

The dummy wire 21 is disposed to face the second wire 20 at the other side in the width direction in spaced-apart relation. The dummy wire 21 is provided corresponding to the first arc portion 11 of the first conductive pattern 4, to be specific, provided corresponding to the ridgeline portion 13 at one side in the width direction in the first arc portion 11. The dummy wire 21 has an arc shape similar to the arc shape of the ridgeline portion 13 at one side in the width direction when viewed from the top. Furthermore, the dummy wire 21 is overlapped with the bent portion 17 of the intermediate insulating layer 5 when viewed from the top.

Meanwhile, the dummy wire 21 is not provided corresponding to the two first linear portions 12 in the first conductive pattern 4. That is, the dummy wire 21 deviates from the first linear portion 12 when projected in the thickness direction.

The dummy wire 21 is not provided corresponding to the ridgeline portion 13 at the other side in the width direction when viewed from the top. That is, the dummy wire 21 deviates from the ridgeline portion 13 at the other side in the width direction when projected in the thickness direction.

Then, the dummy wire 21 is provided corresponding to only the ridgeline portion 13 at one side in the width direction in the first arc portion 11. That is, the dummy wire 21 is overlapped with the ridgeline portion 13 at one side in the width direction in the first arc portion 11 and one side portion in the width direction in the first arc portion 11 (excluding the above-described ridgeline portion 13).

The dummy wire 21 is disposed along the bent portion 17 (inclination face 15) of the intermediate insulating layer 5 when viewed in cross section, and has a generally wave shape when viewed in cross section.

The dummy wire 21 is a wire formed to prevent the reflected light B' at the metal thin film 33 corresponding to the bent portion 17 in the step (4) described later from being focused on the first portion of the photoresist 25, and is originally an unnecessary wire for the wired circuit board 1, but is a necessary wire for the wired circuit board 1 having the bent portion 17.

The dummy wire 21 is independent from the second wire 20 and not electrically connected to the second terminal (not shown). Therefore, the dummy wire 21 does not substantially have a function of wire.

The second conductive pattern 6 is made of the same conductive material as that of the first conductive pattern 4.

The size of the second conductive pattern 6 is set suitably. The second conductive pattern 6 has a thickness of, for example, 1 μm or more, preferably 3 μm or more, and for example, 20 μm or less, preferably 12 μm or less. The second wire 20 has a width W2 of, for example, 5 μm or more, preferably 8 μm or more, and for example, 200 μm or less, preferably 100 μm or less. A width W3 of the dummy wire 21 is set so as to be overlapped with the bent portion 17 when projected in the thickness direction, to be specific, for example, 5 μm or more, preferably 10 μm or more, and for example, 100 μm or less, preferably 50 μm or less. The virtual circle along the dummy wire 21 has a radius R3 of, for example, 5 μm or more, preferably 15 μm or more, and for example, 300 μm or less, preferably 100 μm or less. The interval between the second wire 20 and the dummy wire 21 is, for example, 3 μm or more, preferably 5 μm or more, and for example, 100 μm or less, preferably 50 μm or less.

2. Method for Producing a Wired Circuit Board

Next, description is given below of the production method of the wired circuit board 1 with reference to FIG. 3A to FIG. 6K.

The production method of the wired circuit board 1 includes a step (i) (ref: FIG. 3A), in which the insulating base layer 3 is prepared, a step (ii) (ref: FIG. 3B), in which the first conductive pattern 4 is provided on the insulating base layer 3, and a step (1) (ref: FIG. 3C), in which the intermediate insulating layer 5 is provided on the insulating base layer 3 so as to cover the first conductive pattern 4.

Figure 4D:
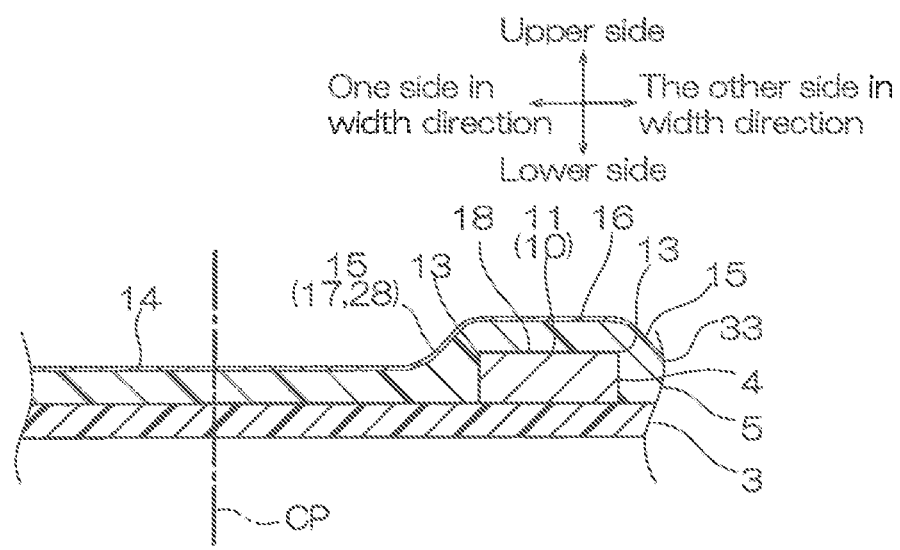
FIG. 4D to FIG. 4F show, following FIG. 3C, the first embodiment of the method for producing a wired circuit board of the present invention, illustrating process diagrams of the first embodiment of the method for producing a wired circuit board.
Figure 4E:
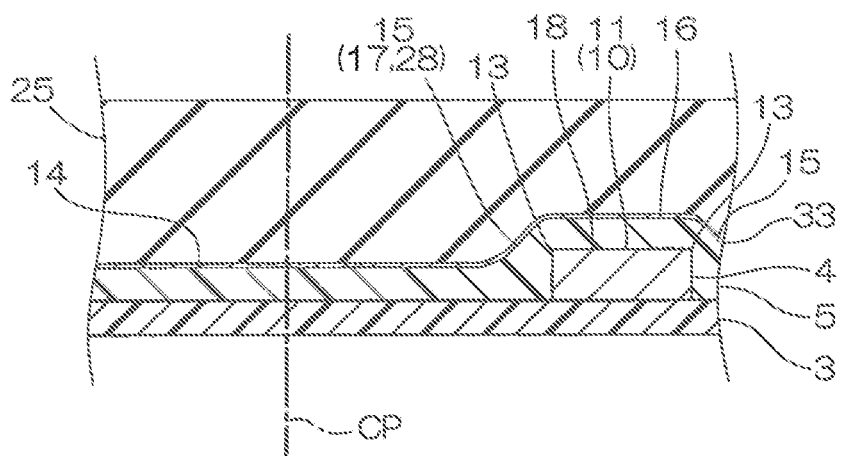
Figure 4F:
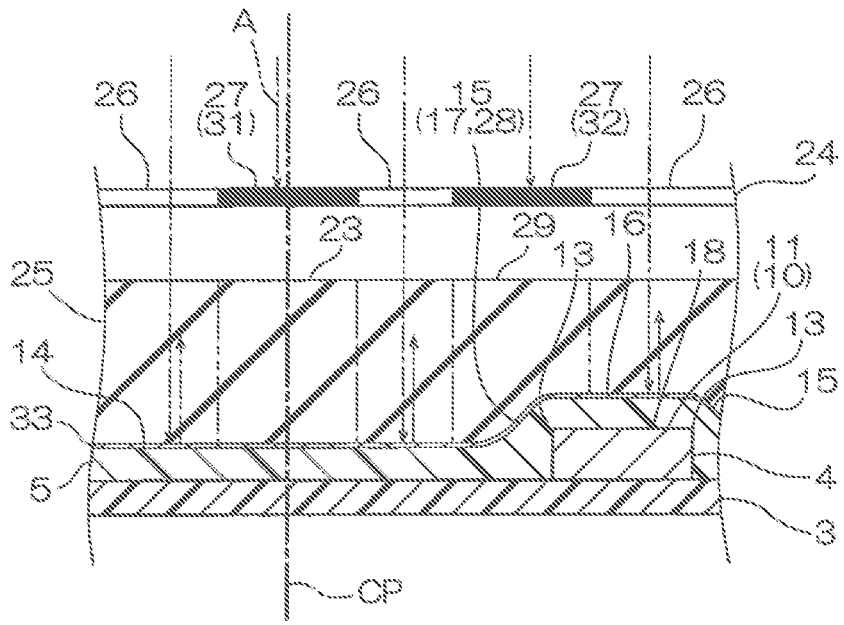

Furthermore, the production method of the wired circuit board 1 includes a step (2) (ref: FIG. 4D), in which the metal thin film 33 is provided at least on the inclination face 15 of the intermediate insulating layer 5, a step (3) (ref: FIG. 4E), in which the photoresist 25 is provided on the metal thin film 33, and a step (4) (ref: FIG. 4F), in which a photomask 24 is disposed so that the first portion 23, i.e., an example of a portion, where the second conductive pattern 6 is to be provided in the photoresist 25, is shielded from light, and the photoresist 25 is exposed to light through the photomask 24.

Furthermore, the production method of the wired circuit board 1 includes a step (5) (ref: FIG. 5G), in which the first portion 23 is removed to expose the metal thin film 33 corresponding to the first portion 23, and a step (6) (ref: phantom line in FIG. 5H), in which the second conductive pattern 6 is provided on the metal thin film 33 exposed from the photoresist 25.

Furthermore, the production method of the wired circuit board 1 includes a step (iii) (ref: FIG. 5I), in which the photoresist 25 is removed, a step (iv) (ref: FIG. 6J), in which the metal thin film 33 corresponding to the photoresist 25 is removed, and a step (v) (ref: FIG. 6K), in which the insulating cover layer 7 is provided on the intermediate insulating layer 5 so as to cover the second conductive pattern 6.

In the production method of the wired circuit board 1, the step (i) to step (ii), the step (1) to step (6), and the step (iii) to step (v) are performed sequentially. In the following, the above-described steps are described in detail.

2-1. Step (i)

As shown in FIG. 3A, in the step (i), the insulating base layer 3 is prepared.

2-2. Step (ii)

As shown in FIG. 3B, in the step (ii), the first conductive pattern 4 is provided on the insulating base layer 3.

2-3. Step (1)

As shown in FIG. 3C, in the step (1), the intermediate insulating layer 5 is provided on the insulating base layer 3 so as to cover the first conductive pattern 4.

To provide the intermediate insulating layer 5 on the insulating base layer 3, for example, varnish of a photosensitive insulating material is applied to the top face of the insulating base layer 3, exposed to light and developed, and thereafter, as necessary, heated. Alternatively, the intermediate insulating layer 5 preformed into a pattern which allows a first terminal, which is not shown, to be exposed is allowed to adhere onto the insulating base layer 3 with an adhesive, which is not shown, interposed therebetween.

At this time, in the intermediate insulating layer 5 corresponding to the first conductive pattern 4, the inclination face 15 and the second flat face 16 are generated.

In this manner, the intermediate insulating layer 5 having the inclination face 15 including the bent portion 17 (ref: FIG. 1) is provided.

2-4. Step (2)

As shown in FIG. 4D, in the step (2), the metal thin film 33 is provided at least on the inclination face 15 of the intermediate insulating layer 5.

The metal thin film 33 can serve as a seed film (feeding layer) in the additive method of the step (6) (described later, ref: FIG. 5H). The metal thin film 33 is a layer that can be integrated with the second conductive pattern 6 when the second conductive pattern 6 is obtained in the additive method (ref: FIG. 2).

The metal thin film 33 is provided on the entire surface of, for example, the top face (including the first flat face 14, the inclination face 15 (including the bent portion 17), and the second flat face 16) of the intermediate insulating layer 5.

The metal thin film 33 is made of a metal material. Examples of the metal material include copper, chromium, nickel, and an alloy thereof, and preferably, copper and chromium are used. The metal thin film 33 can be made of a single or a plurality of layers (not shown in FIG. 4D). Preferably, the metal thin film 33 consists of two layers of a first thin film (to be specific, chromium thin film), and a second thin film (copper thin film) provided thereon.

The metal thin film 33 is in conformity with the top face of the intermediate insulating layer 5. Therefore, in the metal thin film 33, the top face of the portion corresponding to the first flat face 14 and the second flat face 16 of the intermediate insulating layer 5 is parallel with the first flat face 14 and the second flat face 16, that is, is along the surface direction. Meanwhile, in the metal thin film 33, the top face of the portion corresponding to the inclination face 15 (including the bent portion 17) is parallel with the inclination face 15 (including the bent portion 17) of the intermediate insulating layer 5, that is, inclined relative to the surface direction.

The metal thin film 33 has a thickness of, for example, 10 nm or more, preferably 30 nm or more, and for example, 300 nm or less, preferably 200 nm or less. When the metal thin film 33 consists of two layers of the first thin film and the second thin film, the first thin film has a thickness of, for example, 10 nm or more, and 100 nm or less, and the second thin film has a thickness of, for example, 50 nm or more, and 200 nm or less.

To provide the metal thin film 33 on the intermediate insulating layer 5, for example, a sputtering method and a plating method are used, and preferably, a sputtering method is used.

2-5. Step (3)

As shown in FIG. 4E, in the step (3), the photoresist 25 is provided on the metal thin film 33.

The photoresist 25 is a negative type photoresist (negative photoresist). The negative type photoresist is a resist that allows the portion which is exposed to the light at the time of exposure to remain in developing thereafter, and meanwhile, the portion which is shielded from light at the time of exposure (portion to which light is not applied) to be removed in developing thereafter. The photoresist 25 includes, for example, dry film photoresist (DFR). The photoresist 25 can serve as, as shown in FIG. 5H, a plating resist in the plating in the step (6).

The photoresist 25 can allow the light in the step (4) (ref: FIG. 4F) (e.g., ultraviolet ray, etc.) to partially pass through, to be specific, the photoresist 25 has an ultraviolet ray transmissivity of, for example, 10% or more, preferably 20% or more, and for example, 60% or less, preferably 50% or less.

The above-described photoresist 25 is disposed on the entire top face of the metal thin film 33.

At that time, the dry film photoresist is pressed (pushed onto) using, for example, a flat plate. Therefore, the top face of the photoresist 25 is a flat face.

The thickness of the photoresist 25 is not particularly limited, and is, for example, 10 μm or more, and for example, 50 μm or less, preferably 30 μm or less.

2-6. Step (4)

As shown in FIG. 4F, in the step (4), the photomask 24 is disposed so that the first portion 23 in the photoresist 25 and a third portion 29 corresponding to the second portion 28 in the photoresist 25 are shielded from light, thereby exposing the photoresist 25 to light through the photomask 24.

The first portion 23 is a portion that is to be shielded (should be shielded) from light in the photoresist 25 in the step (4). The first portion 23 is a portion to be removed (should be removed), as shown in FIG. 5G, in the following step (5). Furthermore, the first portion 23 is a portion, as shown in FIG. 5H, where the second wire 20 is to be provided at openings 30 (described later) of the photoresist 25 in the following step (6) (charged with). To be specific, the first portion 23 is a portion where the second wire 20 and the second terminal (not shown) are to be provided in the openings 30 of the photoresist 25 in the following step (6) (charged with).

Meanwhile, the third portion 29 is a portion that is shielded from light in the photoresist 25 in the step (4). The third portion 29 is also a portion where the dummy wire 21 is provided in the openings 30 of the photoresist 25 in the following step (6) (charged with).

The photomask 24 includes a translucent portion 26 that allows light from above to pass through below, and a light shield portion 27 that allows light from above to be shielded to below.

The light shield portion 27 has a first light shield portion 31 corresponding to the first portion 23 and a second light shield portion 32 corresponding to the third portion 29.

In the step (4), the photomask 24 is disposed so that the first light shield portion 31 faces the first portion 23, the second light shield portion 32 faces the third portion 29, and the translucent portion 26 faces the portion other than the first portion 23 and the third portion 29 in the photoresist 25. The second light shield portion 32 is overlapped with the second portion 28 of the intermediate insulating layer 5 when projected in the thickness direction. The translucent portion 26 is overlapped with the first flat face 14 and the second flat face 16 of the intermediate insulating layer 5 when projected in the thickness direction.

The photomask 24 is disposed above and faces the photoresist 25 in spaced-apart relation. Although not shown in FIG. 4F, the photomask 24 can also be directly contacted with the top face of the photoresist 25.

In this manner, the photomask 24 is disposed so that the first portion 23 and the third portion 29 in the photoresist 25 are shielded from light. Furthermore, the photomask 24 is disposed so that the portion other than the first portion 23 and the third portion 29 in the photoresist 25 allows light to pass through.

Then, in the step (4), the photoresist 25 is exposed to light through the photomask 24.

To expose the photoresist 25 to light, light is applied to the photomask 24 from the light source disposed above the photomask 24. The wavelength of the light is, for example, 100 nm or more, preferably 350 nm or more, and for example, 800 nm or less, preferably 450 nm or less. The application (exposure) amount is, for example, 100 mJ/cm$^2$ or more and 800 mJ/cm$^2$ or less.

[1] Then, light A applied to the first light shield portion 31 of the photomask 24 is shielded with the first light shield portion 31, and does not reach the first portion 23 of the photoresist 25.

[2] Meanwhile, light B applied to the second light shield portion 32 of the photomask 24 is shielded with the second light shield portion 32, and does not reach the third portion 29 of the photoresist 25. Therefore, the light B also does not reach the metal thin film 33 (metal thin film 33 facing the second portion 28 of the photoresist 25) that is positioned below the third portion 29.

2-7. Step (5)

As shown in FIG. 5G, in the step (5), the first portion 23 (ref: FIG. 4F) in the photoresist 25 is removed. Along with this, the third portion 29 (ref: FIG. 4F) in the photoresist 25 is removed.

To be specific, first, as necessary, the photoresist 25 after exposure is heated (heating after exposure).

Then, the photoresist 25 is developed with a developer. In this manner, the portion other than the first portion 23 and the third portion 29 in the photoresist 25 is left, and only the first portion 23 and the third portion 29 are removed. That is, in the photoresist 25, the openings 30 corresponding to the first portion 23 and the third portion 29 are formed. The openings 30 penetrate the photoresist 25 in the thickness direction.

In this manner, the metal thin film 33 corresponding to the first portion 23 and the third portion 29, that is, the metal thin film 33 facing the openings 30 is exposed.

Thereafter, as necessary, the photoresist 25 is cured by heating.

2-8. Step (6)

As shown in the phantom line of FIG. 5H, in the step (6), first, the second conductive pattern 6 is provided on the metal thin film 33 exposed from the photoresist 25.

To provide the second conductive pattern 6 on the metal thin film 33, electrolytic plating in which electricity is supplied from the metal thin film 33 is used.

At this time, the photoresist 25 is used as a plating resist. The metal thin film 33 is used as a feeding layer.

In this manner, the second conductive pattern 6 is formed as a pattern having the second wire 20, the second terminal, and the dummy wire 21.

2-9. Step (iii)

As shown in FIG. 5I, in the step (iii), the photoresist 25 is removed.

To be specific, the photoresist 25 is removed, for example, by wet etching.

2-10. Step (iv)

As shown in FIG. 6J, in the step (iv), the metal thin film 33 corresponding to the photoresist 25 (ref: FIG. 5H) is removed.

To be specific, the metal thin film 33 positioned below the photoresist 25 is removed, for example, by peeling.

2-11. Step (v)

As shown in FIG. 6K, in the step (v), the insulating cover layer 7 is provided in a pattern such that in the second conductive pattern 6, the second wire 20 and the dummy wire 21 are covered and the second terminal (not shown) is exposed.

The wired circuit board 1 including the insulating base layer 3, the first conductive pattern 4, the intermediate insulating layer 5, the metal thin film 33, the second conductive pattern 6, and the insulating cover layer 7 is produced in this manner.

In the wired circuit board 1, the metal thin film 33 can be integrated with the second conductive pattern 6, to be specific, the metal thin film 33 can be incorporated as a part of the second conductive pattern 6. At that time, as shown in FIG. 1, there may be a case where the metal thin film 33 cannot be distinguished with the second conductive pattern 6 clearly.

Use of such a wired circuit board 1 is not particularly limited, and for example, it is used as various wired circuit boards: a suspension board with circuit included in a hard disk drive and including the metal supporting board (ref: phantom line in FIG. 2), and a flexible wired circuit board not including the metal supporting board and having flexibility. In particular, the wired circuit board 1 is suitably used in a suspension board with circuit that requires a high density wire (conductive pattern), and is a suspension board with circuit having the above-described dummy wire 21 in the head mounting region.

Figure 8B:
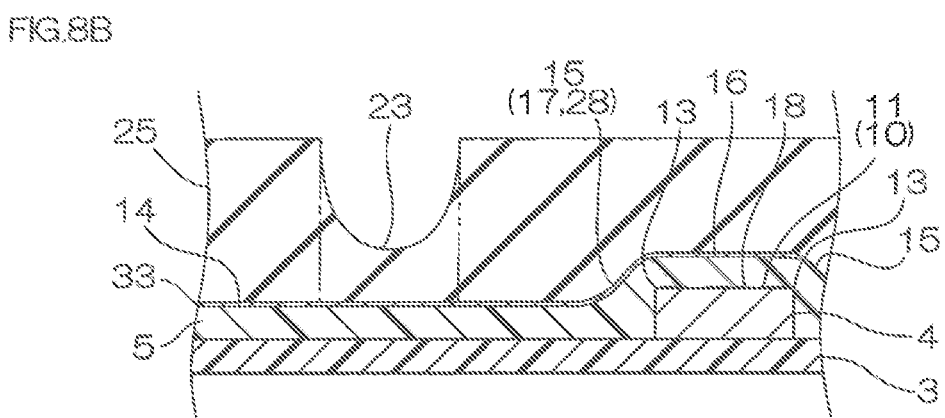

As shown in FIG. 7, even when producing the wired circuit board 1 not having the dummy wire 21 (ref: FIG. 1), as shown in FIG. 8A and FIG. 8B, the step (4) and the step (5) are conducted.

As shown in FIG. 7, in the wired circuit board 1, the second conductive pattern 6 does not have the dummy wire 21, and includes the second wire 20 and the second terminal (not shown).

In the step (4), as shown in FIG. 8A, in the photomask 24, the light shield portion 27 does not have the second light shield portion 32 (ref: FIG. 4F) corresponding to the third portion 29, while having only the first light shield portion 31 corresponding to the first portion 23.

[1] When light is applied to the photomask 24 from the light source, the light A applied to the first light shield portion 31 of the photomask 24 is shielded with the first light shield portion 31, and does not reach the first portion 23 of the photoresist 25.

[2] However, the light B applied to the translucent portion 26 facing the third portion 29 passes through the translucent portion 26, and reaches the third portion 29. Then, the portion of the light B passes through the third portion 29, and reflects at the top face of the metal thin film 33 corresponding to the second portion 28 to produce the reflected light B'. The reflected light B' passes through the photoresist 25 toward obliquely and upwardly one side in the width direction when viewed in cross section, and reaches the first portion 23 of the photoresist 25.

Then, as shown in FIG. 8B, in the step (5), the first portion 23 cannot be completely removed, that is, the first portion 23 is partially or completely left. Thus, in the photomask 24, the openings 30 (ref: FIG. 5G) corresponding to the first portion are not formed. As a result, the metal thin film 33 corresponding to the first portion 23 is covered.

Then, the second wire 20 (ref: phantom line) cannot be formed. That is, the second conductive pattern 6 having deformation is formed.

However, with the production method of the first embodiment, as shown in FIG. 4F, in the step (4), the photomask 24 is disposed so that the photoresist 25 facing the second portion 28 of the intermediate insulating layer 5, that is, the third portion 29 is shielded from light. Therefore, even when the inclination face 15 has the second portion 28 that allows the reflected light B' that reflects at the metal thin film 33 to reach the first portion 23, in the step (4), the third portion 29 is shielded from light, so that the reflected light B' can be prevented from reaching the first portion 23. That is, the occurrence of the reflected light B' can be prevented.

As a result, as shown in FIG. 4F, in the step (4), the first portion 23 is surely shielded from light, and the photoresist 25 other than the first portion 23 (and the third portion 29) can be exposed to light. Thereafter, as shown in FIG. 5G, in the step (5), the metal thin film 33 corresponding to the first portion 23 is surely exposed and subsequently, as shown in FIG. 5H, in the step (6), the second wire 20 in which deformation is suppressed can be surely provided.

Therefore, the second conductive pattern 6 having high reliability can be provided with a high degree of freedom.

Accordingly, the wired circuit board 1 having a high degree of freedom with excellent connection reliability can be produced.

As shown in FIG. 7 and FIG. 8A, when the second portion 28 of the intermediate insulating layer 5 has the bent portion 17 bending in one direction when viewed from the top, the reflected light B', as shown in FIG. 7, is focused toward the first portion 23 corresponding to the center CP when viewed from the top. That is, when viewed from the top, the metal thin film 33 corresponding to the second portion 28 (bent portion 17) works as a concave lens, and the reflected light B' is focused on the point of the first portion 23. Therefore, the amount of light at the first portion 23 is relatively high. To be specific, the amount of light at the first portion 23 is the amount of light that allows the first portion 23 to remain in the step (5) shown in FIG. 8B, or even more.

Figure 8C:
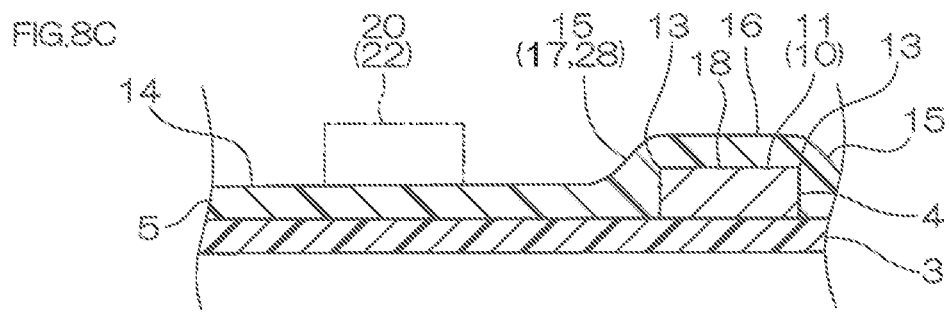

Then, as shown in FIG. 8B, in the step (5), the metal thin film 33 corresponding to the first portion 23 cannot be exposed, and as shown in FIG. 8C, in the step (6), the second conductive pattern 6 having deformation is provided. That is, the reflected light B' corresponding to the bent portion 17 is focused on the first portion 23 of the photoresist 25, thereby revealing deformation of the second wire 20.

However, with the production method of the first embodiment, as shown in FIG. 4F, in the step (4), the photomask 24 is disposed so that the third portion 29 that is the photoresist 25 facing the second portion 28 is shielded from light, and therefore, in the step (4), the first portion 23 can be surely shielded from light. Thereafter, as shown in FIG. 5G, in the step (5), the metal thin film 33 corresponding to the first portion 23 is surely exposed. Subsequently, as shown in FIG. 5H, in the step (6), the second conductive pattern 6 including the second wire 20 in which deformation is suppressed can be surely provided.

With the production method of the first embodiment, as shown in FIG. 4F, in the step (4), the third portion 29, where the dummy wire 21 is to be provided in the photoresist 25, is overlapped with the second portion 28 of the intermediate insulating layer 5 when viewed from the top. Therefore, in the step (4), the third portion 29 can be surely shielded from light and furthermore, the second portion 28 can be shielded from light. Thus, the occurrence of the reflected light B' in the second portion 28 that is overlapped with the third portion 29 can be prevented. Thus, the exposure to light (ref: FIG. 8A) of the first portion 23 caused by the reflected light B' in the second portion 28 is surely prevented, and the second wire 20 can be surely provided.

In the wired circuit board 1, the second conductive pattern 6 has the dummy wire 21 and the dummy wire 21 is overlapped with the bent portion 17 when viewed from the top, so that as shown in FIG. 4F, in photo processing of the step (4), by preventing the unintended reflection corresponding to the bent portion 17 (generation of reflected light B'), the occurrence of the light shielding failure in the portion corresponding to the second wire 20 can be prevented. Therefore, the reliability of the second wire 20 is improved.

4. Modified Example of First Embodiment

In the first embodiment, the bent portion 17 as an example of the bent portion is used. Alternatively, for example, the bent portion is not limited to the bent portion 17.

Although not shown, a curved portion that is curved at a predetermined angle in one direction in a plurality of times or a single time (or a curving portion that curves at a predetermined angle in one direction) can be also used. In such a case, the curved portion (curving portion) includes a part of vertexes and at least two sides continued therefrom of a polygon. The above-described angle, is for example, more than 0 degree, preferably 30 degrees or more, and for example, 90 degrees or less, preferably 60 degrees or less.

As shown in FIG. 1, the shape of the dummy wire 21 is a generally arc shape when viewed from the top, and the shape thereof is not limited to the above-described shape as long as the dummy wire 21 is overlapped with the second portion 28 in the thickness direction.

The dummy wire 21 is overlapped with only the second portion 28 corresponding to the first arc portion 11 in the thickness direction, and furthermore, can be also overlapped with the second portion 28 corresponding to the first linear portion 12.

Second Embodiment

In the second embodiment, for the members and steps that are the same as the first embodiment, the same reference numerals are given and detailed descriptions thereof are omitted.

In the first embodiment, the negative type photoresist 25 is used, and the additive method is used to form the second conductive pattern 6.

However, in the second embodiment, the positive type photoresist 25 is used, and the subtractive method is used to form the second conductive pattern 6.

4-1. Method for Producing a Wired Circuit Board

The production method of the wired circuit board 1 of the second embodiment includes a step (i) (ref: FIG. 3A), in which the insulating base layer 3 of the first embodiment is prepared, a step (ii) (ref: FIG. 3B), in which the first conductive pattern 4 is provided, and a step (1) (ref: FIG. 3C), in which the intermediate insulating layer 5 is provided.

The production method of the wired circuit board 1 of the second embodiment further includes a step (2) (ref: FIG. 9A), in which the conductive layer 34 is provided at least on the inclination face 15 of the intermediate insulating layer 5, a step (3) (ref: FIG. 9B), in which the photoresist 25 is provided on the conductive layer 34, and a step (4) (ref: arrow in FIG. 9B), in which the photomask 24 is disposed so that the first portion 23 of the photoresist 25 is shielded from light, and the photoresist 25 is exposed to light through the photomask 24.

Furthermore, the production method of the wired circuit board 1 of the second embodiment includes a step (5) (ref: FIG. 9C), in which the portion other than the first portion 23 is removed so as to leave the first portion 23 in the photoresist 25, and a step (6) (ref: phantom line in FIG. 10D), in which the conductive layer 34 exposed from the photoresist 25 is removed to form the second conductive pattern 6.

Furthermore, the production method of the wired circuit board 1 includes a step (iii) (ref: FIG. 10E), in which the photoresist 25 is removed, and a step (v) (ref: FIG. 10F), in which the insulating cover layer 7 is provided.

4-2. Step (1) and Step (2)

In the second embodiment, as shown in FIG. 9A and FIG. 9B, the step (1) and the step (2) are sequentially conducted. Alternatively, the step (1) and the step (2) are conducted, for example, simultaneously. In such a case, the two-layer substrate in which the intermediate insulating layer 5 and the conductive layer 34 are laminated is provided on the insulating base layer 3 so as to cover the first conductive pattern 4.

The conductive layer 34 is disposed on the entire top face including the first flat face 14, the inclination face 15, and the second flat face 16 of the intermediate insulating layer 5. The conductive layer 34 extends along the top face of the intermediate insulating layer 5 along the surface direction. The conductive layer 34 is made of the same conductive material as that of the second conductive pattern 6. The thickness of the conductive layer 34 is the same as the thickness of the second conductive pattern 6.

4-3. Step (4)

As shown in FIG. 9B, in the step (4), the photomask 24 is disposed so that the first portion 23 and the third portion 29 are shielded from light in the photoresist 25.

The photoresist 25 is a positive type photoresist (positive photoresist). The positive type photoresist is a resist that allows the portion to which light is applied at the time of exposure to be removed in developing thereafter, and meanwhile, the portion which is shielded from light at the time of exposure (portion to which light is not applied) to remain in developing thereafter.

Thereafter, as shown in the arrow of FIG. 9B, the photoresist 25 is exposed to light through the photomask 24.

[1] Then, the light A applied to the first light shield portion 31 of the photomask 24 is shielded with the first light shield portion 31, and does not reach the first portion 23.

[2] Meanwhile, the light B applied to the second light shield portion 32 of the photomask 24 is shielded with the second light shield portion 32, and does not reach the third portion 29 in the photoresist 25. Thus, the light B does not reach the conductive layer 34 (conductive layer 34 facing the second portion 28) positioned below the third portion 29.

4-4. Step (5)

As shown in FIG. 9C, in the step (5), the photoresist 25 after exposure is developed with, for example, a developer, and the photoresist 25 other than the first portion 23 and the third portion 29 is removed so as to leave the first portion 23 and the third portion 29.

4-5. Step (6)

Figure 10D:
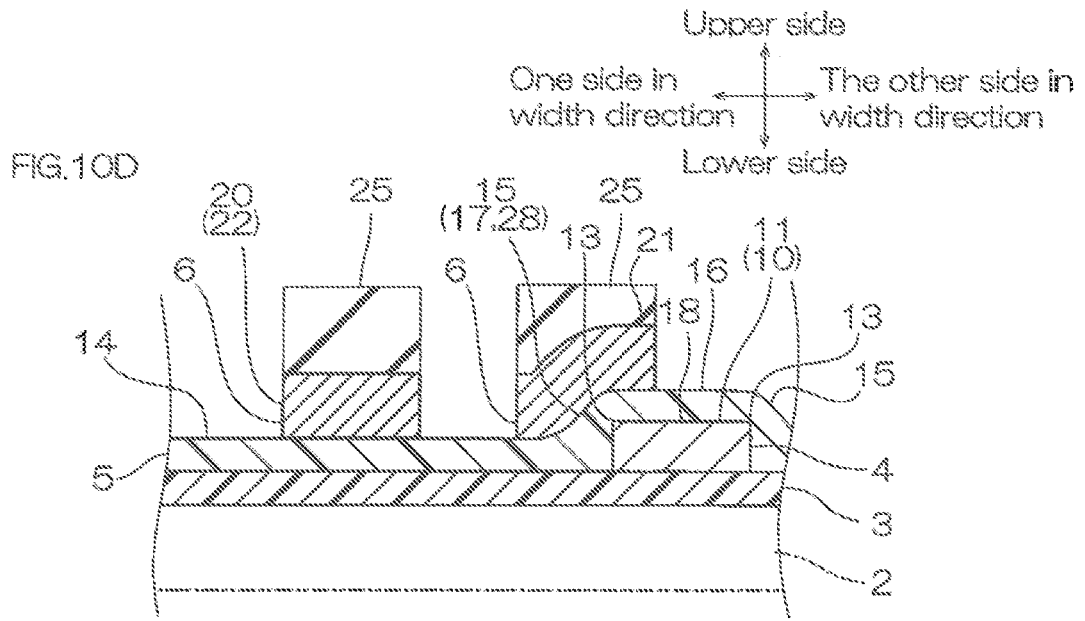
FIG. 10D to FIG. 10F show, following FIG. 9C, process diagrams illustrating the second embodiment of the method for producing a wired circuit board of the present invention.
Figure 10E:
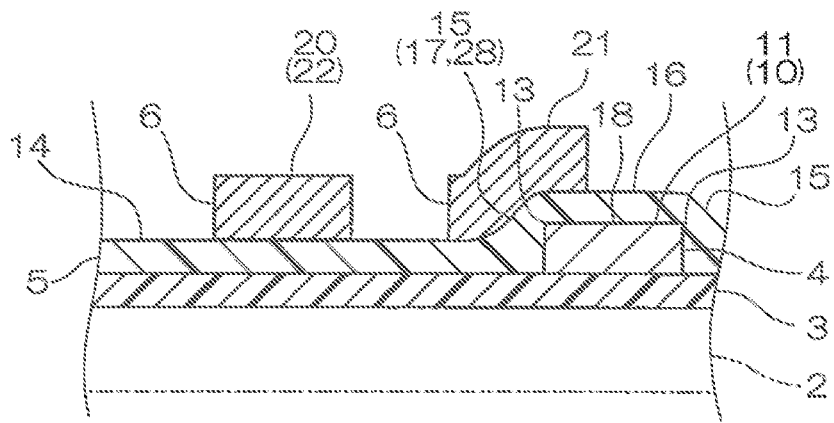
Figure 10F:
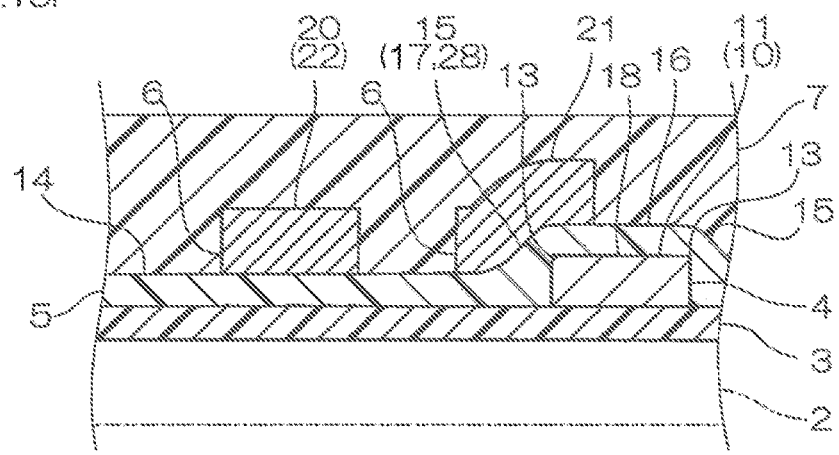

As shown in FIG. 10D, in the step (6), the conductive layer 34 exposed from the photoresist 25 is removed.

For example, the photoresist 25 is used as an etching resist to conduct etching on the conductive layer 34.

In this manner, the second conductive pattern 6 having the second wire 20, the second terminal (not shown), and the dummy wire 21 is formed.

4-6. Step (iii)

As shown in FIG. 10E, in the step (iii), the photoresist 25 is removed, for example, by peeling.

5. Wired Circuit Board

The wired circuit board 1 produced by the above-described production method includes the insulating base layer 3, the first conductive pattern 4, the intermediate insulating layer 5, the second conductive pattern 6, and the insulating cover layer 7 covering the second conductive pattern 6. The wired circuit board 1 in the second embodiment does not include the metal thin film 33 (ref: FIG. 2) unlike the first embodiment.

Meanwhile, the wired circuit board 1 in the second embodiment may include an adhesive layer (not shown) between the second conductive pattern 6 and the intermediate insulating layer 5 so as to allow them to adhere.

With the production method of the second embodiment, as shown in FIG. 9B, in the step (4), the photomask 24 is disposed so that the third portion 29 that is the photoresist 25 facing the second portion 28 is shielded from light. Therefore, even when the inclination face 15 has the second portion 28 that allows the reflected light B' that reflects at the conductive layer 34 to reach the first portion 23, in the step (4), the third portion 29 is shielded from light, so that the reflected light B' can be prevented from reaching the first portion 23. That is, the occurrence of the reflected light B' can be prevented.

As a result, as shown in FIG. 9B, in the step (4), the first portion 23 is surely shielded from light, and the photoresist 25 can be exposed to light. Thereafter, as shown in FIG. 10D, in the step (5), the photoresist 25 other than the first portion 23 and the third portion 29 is surely removed so as to leave the first portion 23 and the third portion 29, and subsequently, as shown in FIG. 10E, in the step (6), the second wire 20 in which deformation is suppressed can be surely provided.

Therefore, the second conductive pattern 6 having high reliability can be provided with a high degree of freedom.

As a result, the wired circuit board 1 having a high degree of freedom with excellent connection reliability can be produced.

Third Embodiment

In the third embodiment, for the members and steps that are the same as the first and second embodiments, the same reference numerals are given and detailed descriptions thereof are omitted.

1. Wired Circuit Board

As shown in FIG. 1 and FIG. 2, the wired circuit board 1 of the first embodiment includes the dummy wire 20 that is independent from the second wire 20.

Figure 11:
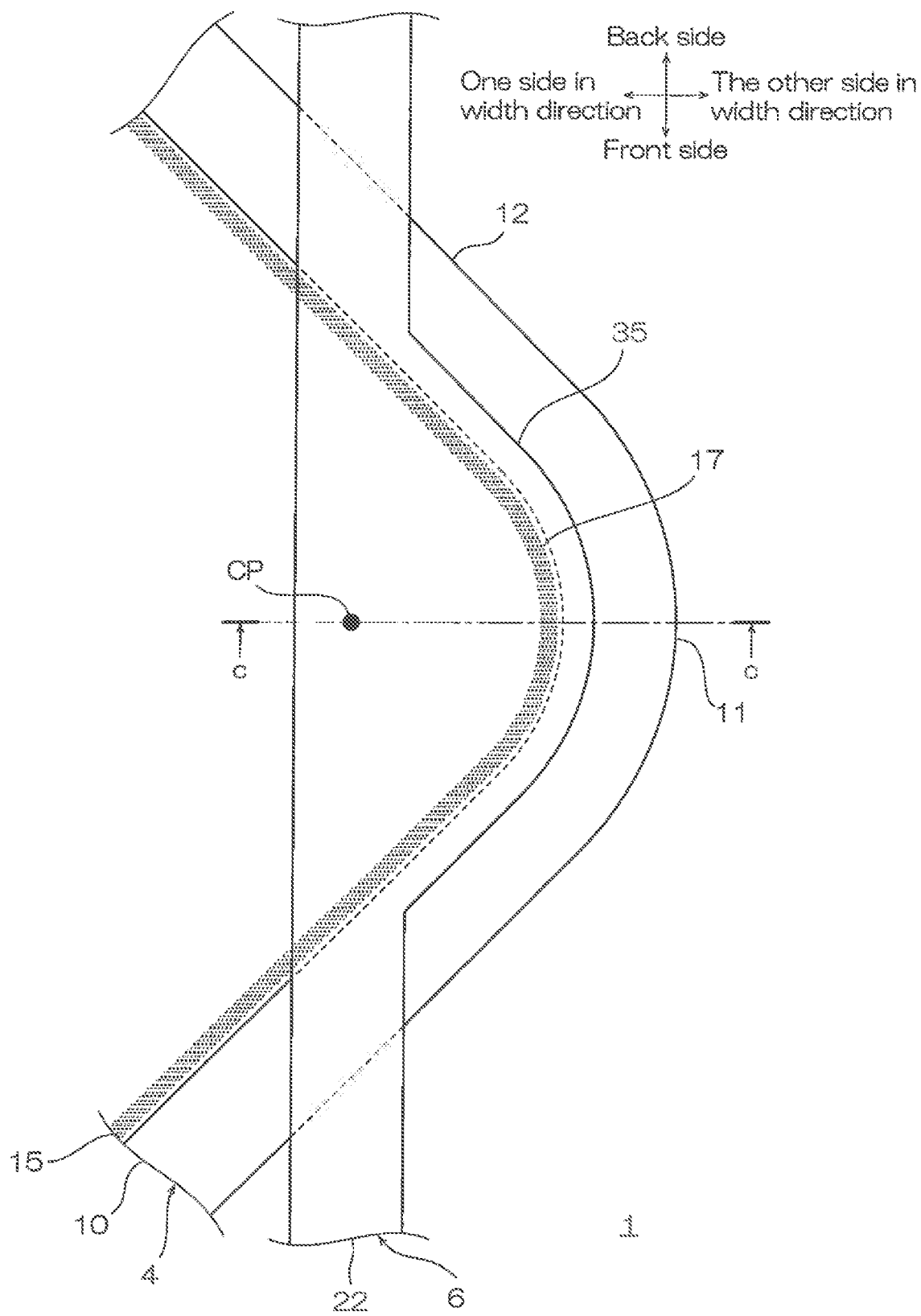
FIG. 11 shows a plan view of the wired circuit board in a third embodiment of the present invention.

However, as shown in FIG. 11 and FIG. 12, in the third embodiment, the wired circuit board 1 includes a dummy portion 35 that continues from the second wire 20.

1-1. Dummy Portion

The dummy portion 35 is included in the second conductive pattern 6. The dummy portion 35 is a projection portion that projects from the other end portion in the width direction of the second linear portion 22 toward the other side in the width direction. The dummy portion 35 has a generally triangular shape with one vertex in a bent shape. The dummy portion 35 (right side, projection piece) has a shape similar to the first arc portion 11 of the first wire 10. The dummy portion 35 continues from the second linear portion 22 in the width direction.

The maximum length in a projection direction (width direction) of the dummy portion 35 is set suitably, for example, 5 μm or more, preferably 15 μm or more, and for example, 300 μm or less, preferably 100 μm or less.

2-1. Step (4)

Figure 13A:
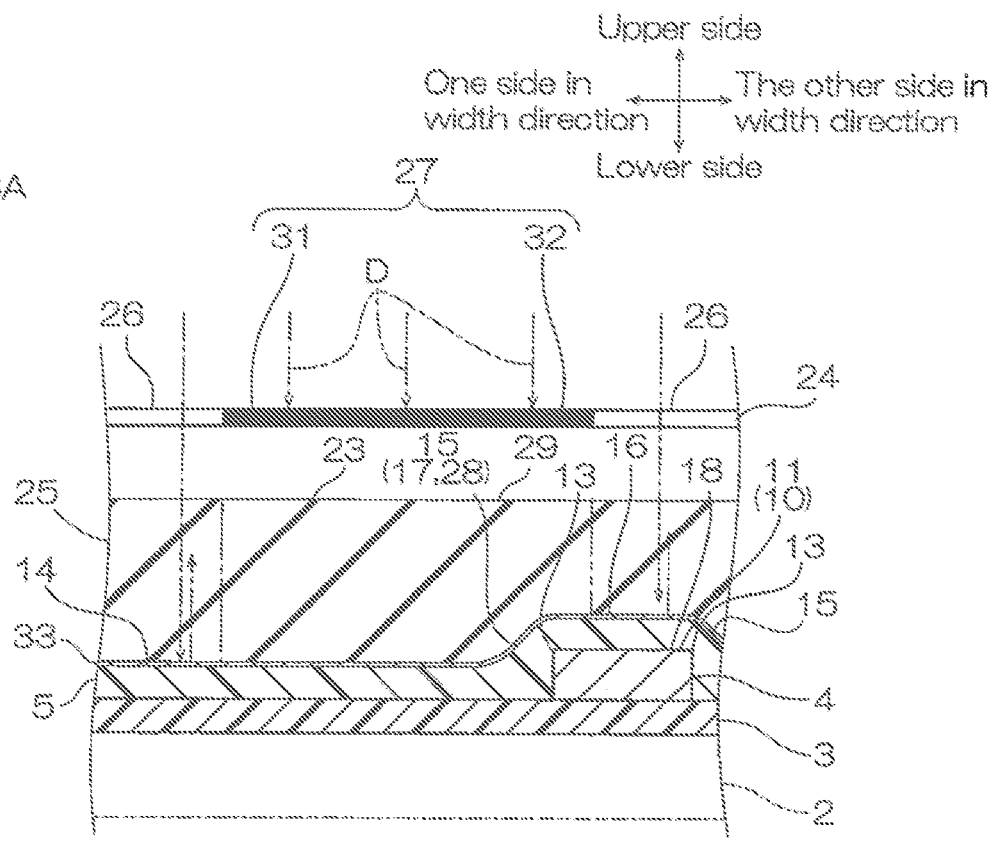
FIG. 13A to FIG. 13C show the third embodiment of the method for producing a wired circuit board of the present invention, illustrating process diagrams of the method for producing a wired circuit board shown in FIG. 12.

In the production method of the wired circuit board 1, as shown in FIG. 13A, in the step (4), the photomask 24 having the light shield portion 27 that has the first light shield portion 31 and the second light shield portion 32 continuing in the width direction each other is disposed.

As shown in the arrow of FIG. 13A, light D applied to the light shield portion 27 including the first light shield portion 31 and the second light shield portion 32 does not reach the first portion 23 and the third portion 29. Thus, the light D does not reach the metal thin film 33 positioned below the third portion 29.

2-2. Step (5)

Figure 13B:
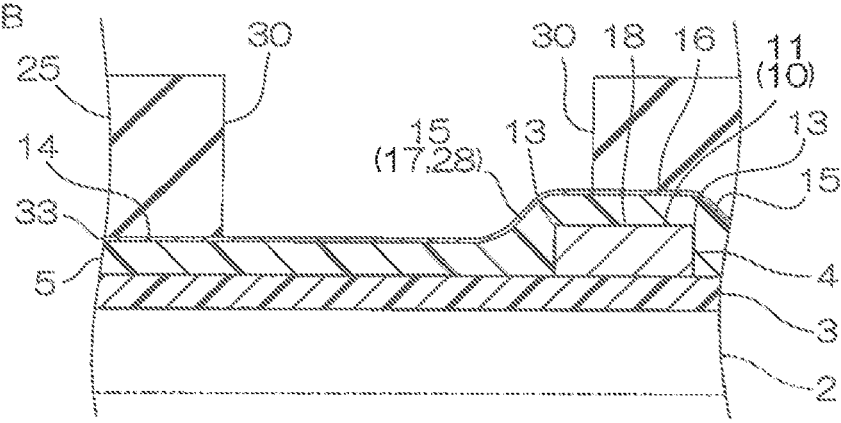

As shown in FIG. 13B, the first portion 23 and the third portion 29 are collectively removed.

In this manner, the large opening 30 corresponding to the first portion 23 and the third portion 29 is formed in the photoresist 25.

2-3. Step (6)

Figure 13C:
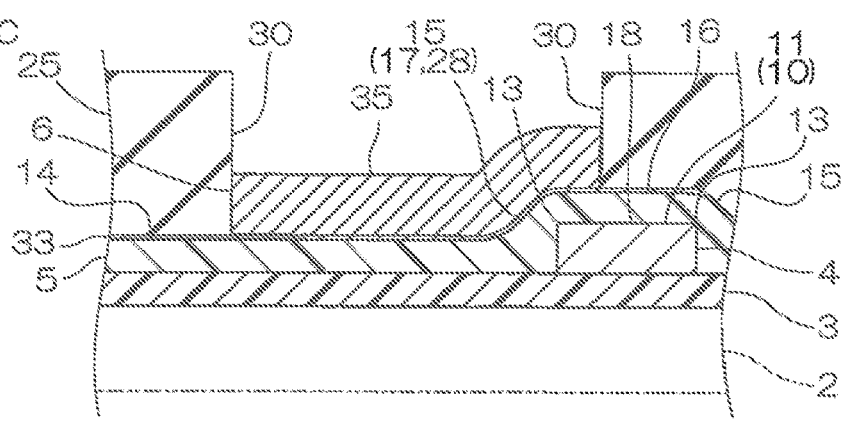

As shown in FIG. 13C, the second conductive pattern 6 is provided on the metal thin film 33 exposed from the opening 30 of the photoresist 25.

2-4. Step (iii)

As shown in FIG. 14D, in the step (iii), the photoresist 25 is removed.

2-5. Step (iv)

As shown in FIG. 14E, in the step (iv), the metal thin film 33 corresponding to the photoresist 25 (ref: FIG. 13C) is removed.

2-6. Step (v)

As shown in FIG. 14F, in the step (v), the insulating cover layer 7 is provided in a pattern which covers the second wire 20 and the dummy portion 35 of the second conductive pattern 6 and exposes the second terminal (not shown).

With the production method of the third embodiment, as shown in FIG. 13A, in the step (4), the third portion 29, where the dummy portion 35 is to be provided in the photoresist 25, is overlapped with the second portion 28 when viewed from the top. Accordingly, in the step (4), the third portion 29 can be surely shielded from light. Therefore, the occurrence of the reflected light B' (ref: FIG. 8A) in the second portion 28 that is overlapped with the third portion 29 can be prevented. As a result, the exposure to light of the first portion 23 caused by the reflected light B' in the second portion 28 is surely prevented, and the second wire 20 can be surely provided.

Furthermore, as shown in FIG. 11, the dummy portion 35 continues from the second wire 20, so that a simpler configuration can be achieved than the first embodiment (ref: FIG. 1) in which the second wire 20 and the dummy wire 21 are separately provided.

3. Modified Example of Third Embodiment

The wired circuit board 1 of the third embodiment is produced using the negative type photoresist 25. In the modified example, though not shown, the wired circuit board 1 of the third embodiment can be also produced using the positive type photoresist 25.

As shown in FIG. 11, the shape of the dummy portion 35 is a generally triangular shape when viewed from the top, and the shape thereof is not limited to the above-described shape as long as the dummy portion 35 is overlapped with the second portion 28 in the thickness direction.

The dummy portion 35 is overlapped with only the second portion 28 corresponding to the first arc portion 11, and furthermore, can be also overlapped with the second portion 28 corresponding to the first linear portion 12.

Fourth Embodiment

In the fourth embodiment, for the members and steps that are the same as the first to third embodiments, the same reference numerals are given and detailed descriptions thereof are omitted.

In the first embodiment to the third embodiment, as shown in FIG. 1 and FIG. 2, the first conductive pattern 4 has the first arc portion 11.

Figure 15:
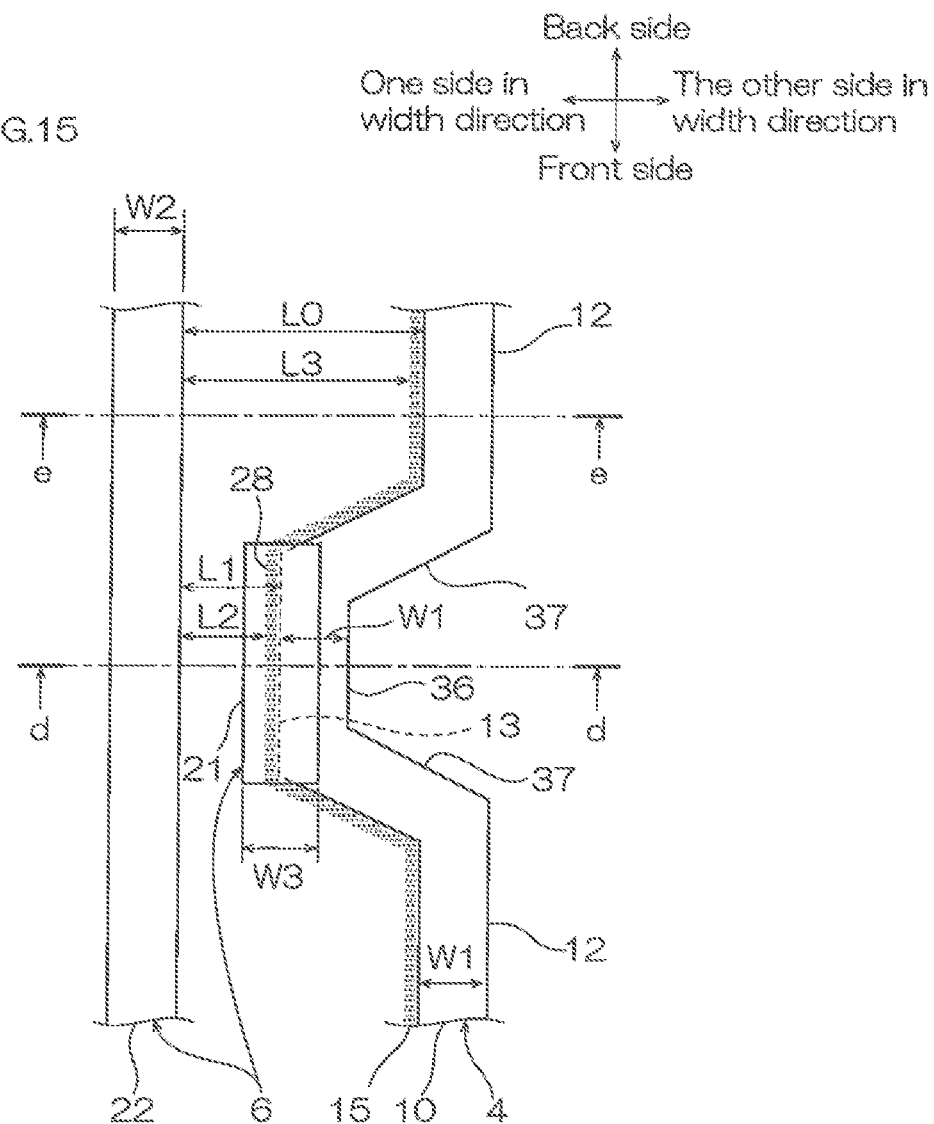
FIG. 15 shows a plan view of the wired circuit board in a fourth embodiment of the present invention.

However, as shown in FIG. 15, in the fourth embodiment, the first conductive pattern 4 has a third linear portion 36.

1. First Conductive Pattern

In the first conductive pattern 4, when viewed from the top, the first wire 10 integrally includes the two first linear portions 12 that are relatively far from the second linear portion 22 of the second conductive pattern 6, the third linear portion 36 that is closer relative to the second linear portion 22, and a second connecting portion 37 that connects the first linear portion 12 and the third linear portion 36.

The two first linear portions 12 are disposed in spaced-apart relation in the front-back direction. Each of the two first linear portions 12 extends in the front-back direction. To be specific, each of the two first linear portions 12 is parallel with the second linear portion 22 of the second conductive pattern 6 when viewed from the top. The two first linear portions 12 are overlapped when projected in the front-back direction. That is, a distance L0 between one first linear portion 12 and the second linear portion 22 in the width direction is the same as the distance L0 between the other first linear portion 12 and the second linear portion 22 in the width direction.

The third linear portion 36 is disposed between the two first linear portions 12 when projected in the width direction. The third linear portion 36 extends in the front-back direction. The third linear portion 36 is parallel with the first linear portion 12. The third linear portion 36 is parallel with the second linear portion 22 of the second conductive pattern 6. The third linear portion 36 is positioned at one side in the width direction relative to the two first linear portions 12 when projected in the front-back direction. That is, when viewed from the top, a distance (interval) L1 between the third linear portion 36 and the second linear portion 22 in the width direction is smaller than the distance (interval) L0 between the two first linear portions 12 and the second linear portion 22 in the width direction.

When viewed from the top, the distance (interval) L1 between the third linear portion 36 and the second linear portion 22 in the width direction is, for example, more than 7.5 μm, and for example, 22.5 μm or less, preferably 17.5 μm or less, more preferably 12.5 μm or less. The distance L1 (μm) satisfies the formula (2).

$$L1 \leq -2 \times W2 + 37.5 \quad (2)$$

W2 is a width of the second linear portion 22 of the second conductive pattern 6 and an example of the width W of the wire. The unit is μm.

That is, as the width W2 of the second linear portion 22 becomes smaller, the distance L1 is allowed to be long.

When the distance L1 and the width W2 of the second linear portion 22 described above do not satisfy the above-described formula (2), that is, the left side is larger than the right side in the formula (2), deformation of the second wire 20 caused by the reflected light B' reaching the first portion 23 of the photoresist 25 can be solved without providing the dummy wire 21 in the wired circuit board 1. Then, providing the dummy wire 21 may have no significance.

Meanwhile, when viewed from the top, the distance (interval) L0 between the first linear portion 12 and the second linear portion 22 in the width direction is, for example, 25 μm or more, preferably 30 μm or more, and for example, 1000 μm or less.

The second connecting portion 37 independently includes a portion connecting the front end portion of the third linear portion 36 to the back end portion of the front-side first linear portion 12, and a portion connecting the back end portion of the third linear portion 36 to the front end portion of the back-side first linear portion 12.

Accordingly, the first wire 10 bends toward one side in the width direction, when reaching from the front-side first linear portion 12 to the front-side second connecting portion 37; next, bends toward the other side in the width direction, when reaching from the front-side second connecting portion 37 to the third linear portion 36; then, bends toward the other side in the width direction, when reaching from the third linear portion 36 to the back-side second connecting portion 37; and bends toward one side in the width direction, when reaching from the back-side second connecting portion 37 to the back-side first linear portion 12.

2. Intermediate Insulating Layer

Figure 16A:
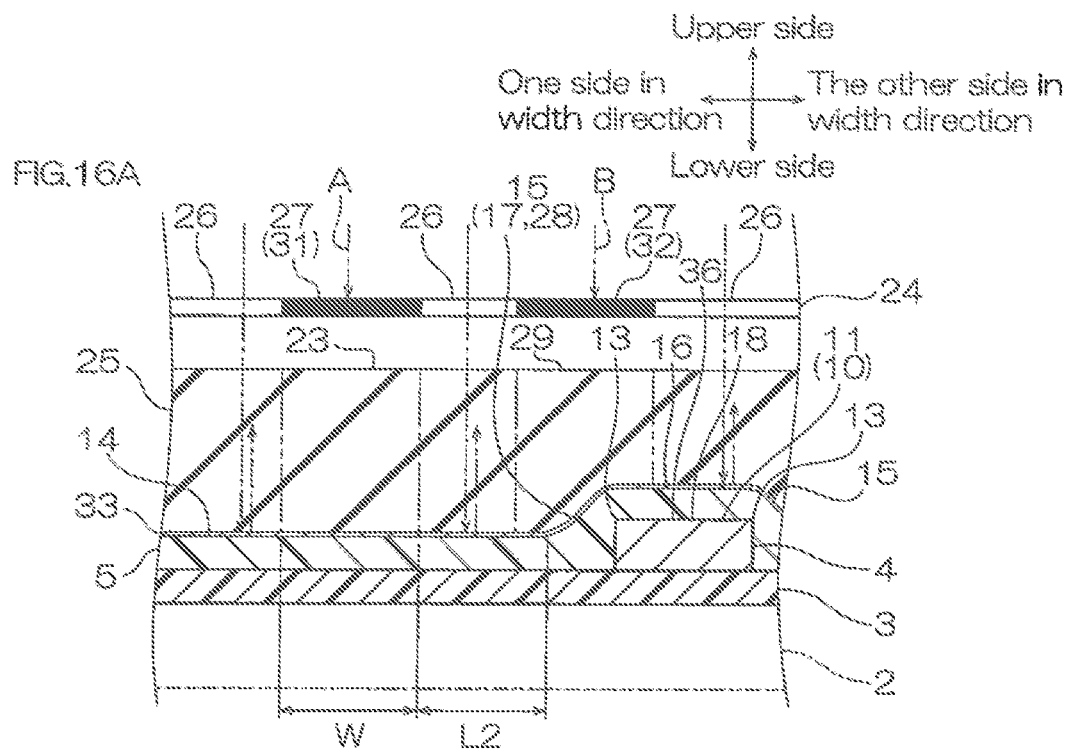
FIG. 16A to FIG. 16C are process diagrams illustrating production of the wired circuit board shown in FIG. 15 and show cross-sectional views along line d-d of the wired circuit board shown in FIG. 15.
Figure 16B:
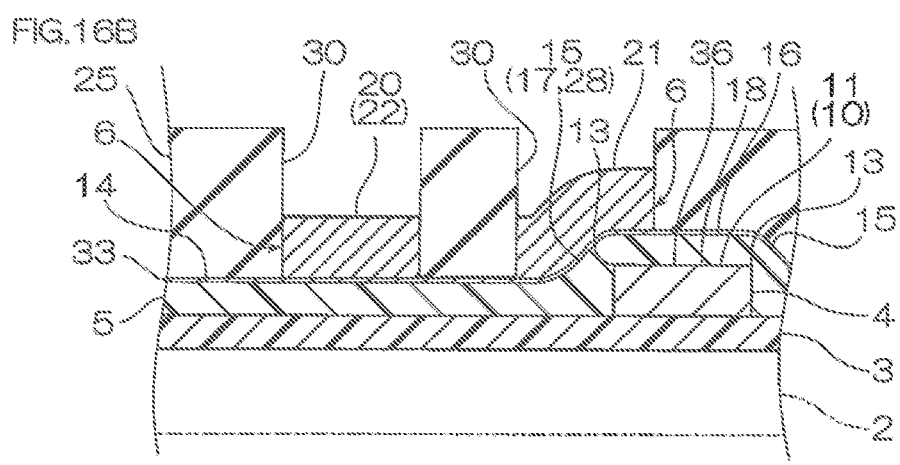
Figure 16C:
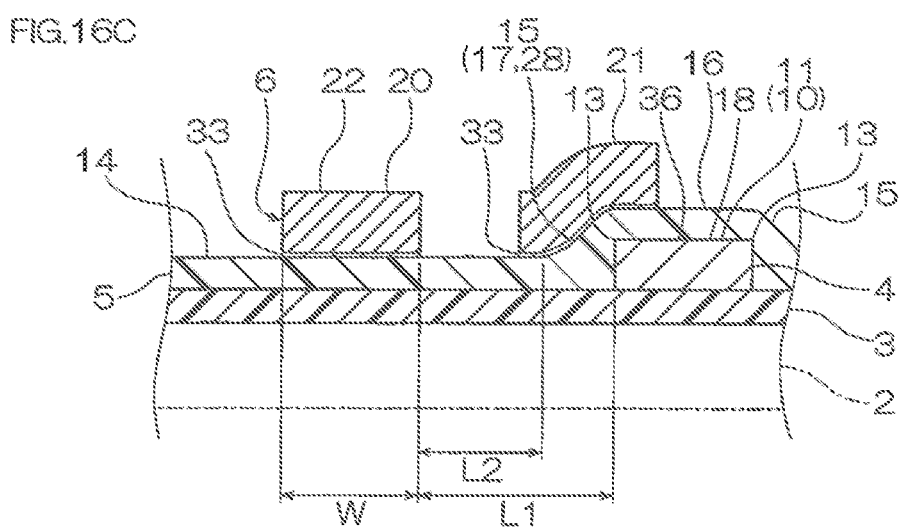

As shown in FIG. 16C and FIG. 17C, the intermediate insulating layer 5 has the inclination face 15 corresponding to the ridgeline portion 13 at one side in the width direction of the first wire 10 (including the third linear portion 36).

A distance L2 (example of L) between one end portion in the width direction (rising portion) of the inclination face 15 corresponding to the third linear portion 36 and the other end portion in the width direction of the second linear portion 22 is, more than 5 μm, and 20 μm or less, preferably 15 μm or less, more preferably 10 μm or less.

When the distance L2 is more than the above-described upper limit, deformation of the second wire 20 caused by the reflected light B' reaching the first portion 23 of the photoresist 25 can be solved without providing the dummy wire 21 in the wired circuit board 1. Then, providing the dummy wire 21 may have no significance.

Along with the width W2 (μm) of the second linear portion 22, the distance L2 (μm) satisfies the formula (1).

$$L2 \leq -2 \times W2 + 35 \quad (1)$$

Figure 25:
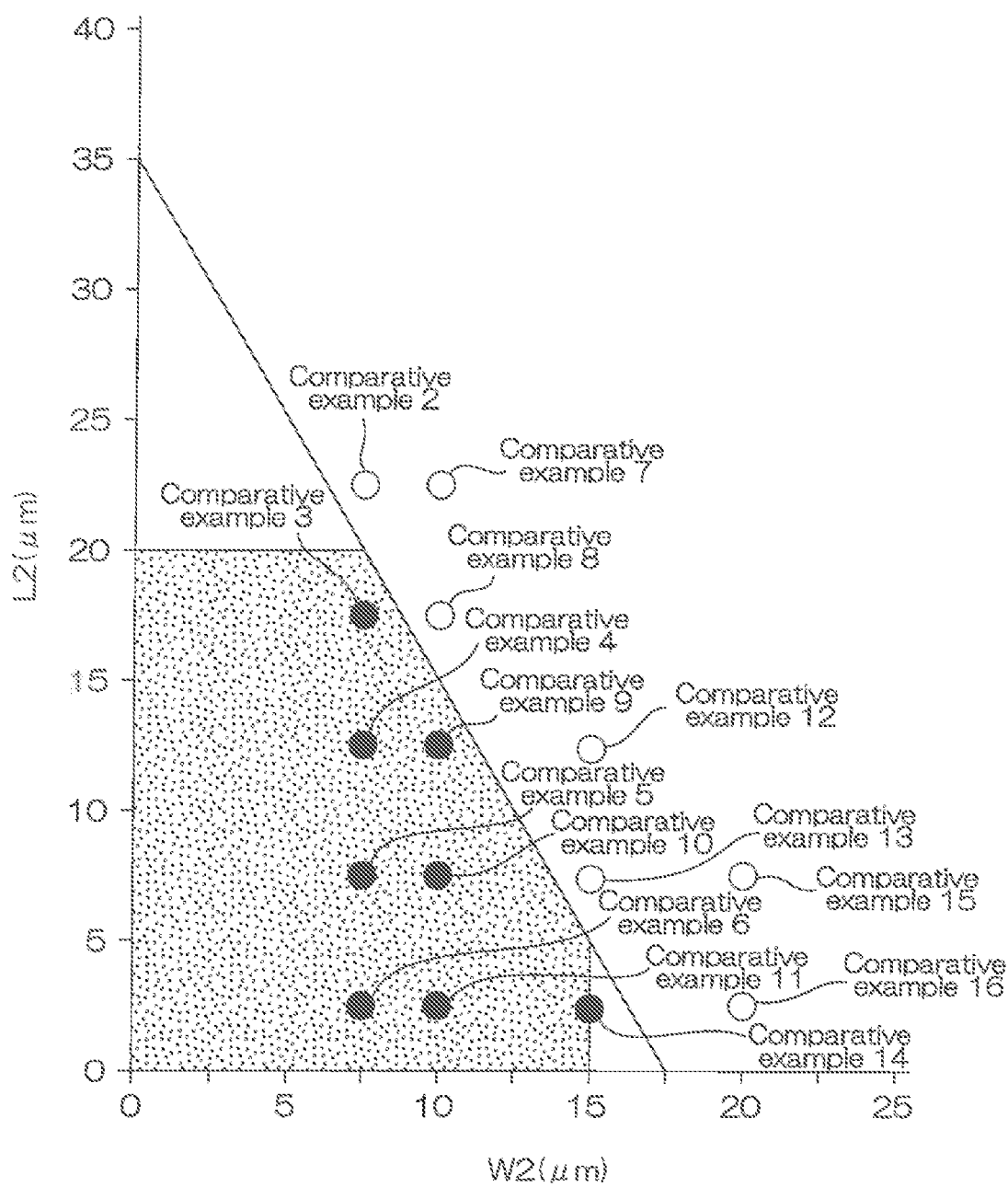
FIG. 25 is a graph showing the relationship between L2 and W2 in Comparative Example 2 to Comparative Example 16.

That is, as the width W2 of the second linear portion 22 becomes smaller, the distance L2 is allowed to be long. In the graph shown in FIG. 25, the distance L2 and the width W2 include the straight line of "L2=−2×W2+35" and should be in the left-lower region of the straight line.

When the distance L2 and the width W2 of the second linear portion 22 described above do not satisfy the above-described formula (1), that is, the left side is larger than the right side in the formula (1), deformation of the second wire 20 caused by the reflected light B' reaching the first portion 23 of the photoresist 25 can be solved without providing the dummy wire 21 in the wired circuit board 1. Then, providing the dummy wire 21 may have no significance.

On the other hand, when the distance L1 and the width W2 of the second linear portion 22 satisfy the above-described formula (2), as shown in FIG. 8A, in the width W2 of the second linear portion 22, the distance L1 between the third linear portion 36 and the metal thin film 33 corresponding to the first portion 23 is a distance (short distance) of the reflected light B' reaching the first portion 23 when viewed from the top. Therefore, by providing the dummy wire 21, deformation of the second linear portion 22 having the width W2 needs to be prevented.

A length (=L2−L1) obtained by subtracting the distance L1 from the distance L2 described above is, for example, more than 0 μm, preferably 1 μm or more, and for example, 10 pin or less.

Meanwhile, a distance L3 between one end portion in the width direction (rising portion) of the inclination face 15 corresponding to the first linear portion 12 and the other end portion in the width direction of the second linear portion 22 is, for example, 20 μm or more, furthermore 25 μm or more, and for example, 1000 μm or less.

3. Second Conductive Pattern

3-1. Second Linear Portion

The second linear portion 22 has the width W2 of, for example, 15 μm or less, preferably 12.5 μm or less, more preferably 10 μm or less, and for example, 1 μm or more, preferably 5 μm or more.

When the width W2 of the second linear portion 22 is more than the above-described upper limit, deformation of the second wire 20 caused by the reflected light B' reaching the first portion 23 of the photoresist 25 can be solved without providing the dummy wire 21 in the wired circuit board 1. Then, providing the dummy wire 21 may have no significance.

3-2. Dummy Wire

The dummy wire 21 is provided corresponding to the third linear portion 36. To be specific, the dummy wire 21 is provided corresponding to the ridgeline portion 13 at one side in the width direction of the third linear portion 36. The dummy wire 21 has a generally linear shape similar to the linear shape of the ridgeline portion 13 at one side in the width direction. Furthermore, the dummy wire 21 is overlapped with the inclination face 15 when viewed from the top. The dummy wire 21 is disposed next to the second linear portion 22 at the other side in the width direction in spaced-apart relation when viewed from the top. The dummy wire 21 is shorter than the second linear portion 22 in the front-back direction.

Meanwhile, the dummy wire 21 is not provided corresponding to the first linear portion 12. The dummy wire 21 is not overlapped with the first linear portion 12 when projected in the thickness direction.

4. Method for Producing a Wired Circuit Board

The production method of the wired circuit board 1 of the fourth embodiment is the same production method as that of the first embodiment.

In the fourth embodiment, when the distance L2 and the width W2 described above are set in the above-described range and the above-described formula (1) is satisfied, the photomask 24 does not have the second light shield portion 32, and upon performing the step (4), as shown in FIG. 8A, the reflected light B' at the inclination face 15 is generated, and then, the first portion 23 is exposed to light caused by the reflected light B'. That is, the first portion 23 remains by the unintended reflected light B' corresponding to the inclination face 15, and therefore, the reliability of the second wire 20 is decreased.

To be specific, in Comparative Examples 3 to 6, 9 to 11, and 14 described later in detail, the distance L2, the width W2, and the formula (1) are satisfied, so that as shown in FIG. 8A, the distance (short distance) of the reflected light B' reaching the first portion 23 is achieved, the amount of light at the first portion 23 is high, to be specific, the amount of light is the amount of light that allows the first portion 23 to remain in developing, or even more. Thus, the evaluation of the shape of the second wire 20 is bad.

Accordingly, as in the fourth embodiment, the photomask 24 is disposed so that the third portion 29 is shielded from light. That is, the second light shield portion 32 faces the third portion 29. Thus, as shown in FIG. 16A, in the step (4), the first portion 23 is surely shielded from light and the photoresist 25 can be exposed to light. Thereafter, as shown in FIG. 16B, in the step (5), the metal thin film 33 corresponding to the first portion 23 can be surely exposed. Then, as shown in FIG. 16C, in the step (6), the second wire 20 in which deformation is suppressed can be surely provided.

To be specific, in each of Examples 2 to 9 corresponding to the above-described Comparative Examples 3 to 6, 9 to 11, and 14, the evaluation of the shape of the second wire 20 is good.

As shown in FIG. 15 and FIG. 17A, the first portion 23 corresponding to the second linear portion 22 is disposed relatively far from the first linear portion 12, so that as shown in FIG. 17B and FIG. 17C, even when the dummy wire 21 corresponding to the first linear portion 12 is not provided, the reflected light B' at the second portion 28 corresponding to the third linear portion 36 does not reach the first portion 23. Thus, deformation of the second linear portion 22 does not occur, and there is no need for providing the dummy wire 21.

5. Modified Example of Fourth Embodiment

As shown in FIG. 15, in the fourth embodiment, the third linear portion 36 is provided in the first conductive pattern 4, and the dummy wire 21 that is overlapped with the third linear portion 36 is provided when projected in the thickness direction.

However, as shown in FIG. 18, a fourth linear portion 38 is provided in the second conductive pattern 6, and the dummy wire 21 can be disposed next to the fourth linear portion 38 at the other side in the width direction when viewed from the top.

As shown in FIG. 18, the first wire 10 consists of only the first linear portion 12.

When viewed from the top, the second wire 20 integrally includes the two second linear portions 22 that are relatively far from the first linear portion 12, the fourth linear portion 38 that is closer relative to the second linear portion 22, and a first connecting portion 39 that connects the second linear portion 22 and the fourth linear portion 38.

The dummy wire 21 is short relative to the first linear portion 12 in the front-back direction. Meanwhile, when projected in the width direction, the dummy wire 21 is overlapped with the fourth linear portion 38, to be more specific, positioned at the same position as the fourth linear portion 38.

The wired circuit board 1 in the modified example is produced in the same manner as that of the wired circuit board 1 of the first embodiment, and achieves the same operations and effects as those of the first embodiment.

As shown in FIG. 19, the first wire 10 may not have the first linear portion 12 and the second connecting portion 37 (ref: FIG. 15) and may consist of only the third linear portion 36, and the second wire 20 may not have the second linear portion 22 and the first connecting portion 39 (ref: FIG. 18) and may consist of only the fourth linear portion 38. In such a case, the dummy wire 21 is parallel with the first wire 10 and the second wire 20, and extends long in the front-back direction. The dummy wire 21 has a linear shape along the front-back direction. The dummy wire 21 is overlapped with the inclination face 15 corresponding to the ridgeline portion 13 at one side in the width direction of the first wire 10 (third linear portion 36) when projected in the thickness direction.

The wired circuit board 1 of the fourth embodiment is produced using the negative type photoresist 25. In the modified example, though not shown, the wired circuit board 1 of the fourth embodiment can be also produced using the positive type photoresist 25.

Fifth Embodiment

In the fifth embodiment, for the members and steps that are the same as the first to fourth embodiments, the same reference numerals are given and detailed descriptions thereof are omitted.

In the fifth embodiment, as shown in FIG. 20 and FIG. 21, the second conductive pattern 6 includes the dummy portion 35.

In the fifth embodiment, each of the first wire 10 and the second wire 20 is the same as the first wire 10 and the second wire 20 of the fourth embodiment.

1. Dummy Portion

As shown in FIG. 20 and FIG. 21, in the fifth embodiment, the dummy portion 35 that continues from the second wire 20 is included.

The dummy portion 35 projects from the other end portion in the width direction of the second wire 20 so as to reach one end portion in the width direction of the third linear portion 36 when projected in the thickness direction. That is, the dummy portion 35 is a projection portion that projects from the second wire 20 toward the other side in the width direction. The dummy portion 35 has a generally rectangular shape or a generally trapezoidal shape when viewed from the top. The dummy portion 35 continues from the second wire 20 in the width direction.

The maximum length in the projection direction (width direction) of the dummy portion 35 is set suitably, for example, 3 μm or more, preferably 5 μm or more, and for example, 300 μm or less, preferably 100 μm or less.

2. Method for Producing a Wired Circuit Board

The wired circuit board 1 of the fifth embodiment is produced by the same production method as that of the third embodiment (ref: FIG. 13A to FIG. 13C).

The fifth embodiment also achieves the same operations and effects as those of the fourth embodiment.

Furthermore, as shown in FIG. 20, the dummy portion 35 continues from the second wire 20, so that a simpler configuration can be achieved than the fourth embodiment (ref: FIG. 15) in which the second wire 20 and the dummy wire 21 are separately provided.

3. Modified Example of Fifth Embodiment

As shown in FIG. 20 and FIG. 21, in the fifth embodiment, the third linear portion 36 is provided in the first conductive pattern 4, and the dummy portion 35 that is overlapped with the third linear portion 36 is provided when projected in the thickness direction.

However, as shown in FIG. 22, the fourth linear portion 38 is provided in the second conductive pattern 6, and the dummy portion 35 can continue from the fourth linear portion 38 at the other side in the width direction when viewed from the top.

The dummy portion 35 is a projection portion that projects from the other end portion in the width direction of the fourth linear portion 38 toward the other side in the width direction.

As shown in FIG. 23, the first wire 10 may not have the first linear portion 12 and the second connecting portion 37 (ref: FIG. 20) and may consist of only the third linear portion 36, and the second wire 20 may not have the second linear portion 22 and the first connecting portion 39 (ref: FIG. 22) and may consist of only the fourth linear portion 38. In such a case, the dummy portion 35 can be formed to be parallel with the first wire 10 and the second wire 20, and extend long and wide in the front-back direction.

The dummy portion 35 is overlapped with the inclination face 15 corresponding to the ridgeline portion 13 at one side in the width direction of the first wire 10 (third linear portion 36) when projected in the thickness direction. The dummy portion 35 is a pattern of being overlapped with one end portion in the width direction of the first wire 10 in the entire front-back direction when viewed from the top. The second conductive pattern 6 having the dummy portion 35 is a wider wiring pattern than the first conductive pattern 4.

In the wired circuit board 1 of the fifth embodiment, either the negative type photoresist 25 or the positive type photoresist 25 can be used.

Modified Example of First to Fifth Embodiments

The inclination face 15 of the intermediate insulating layer 5 of the first to fifth embodiments corresponds to the ridgeline portion 13 of the first conductive pattern 4.

However, for example, as shown in FIG. 24, the inclination face 15 does not correspond to the first conductive pattern 4, and the insulating base layer 3 as an example of the insulating layer simply has a plurality of a thickness T1 and a thickness T2, so that the insulating base layer 3 can also have the inclination face 15. The thickness T1 is the thickness of the insulating base layer 3 in the first flat face 14. The thickness T2 is the thickness of the insulating base layer 3 in the second flat face 16.

The wired circuit board 1 includes the insulating base layer 3, the first conductive pattern 4 that is provided on the insulating base layer 3, and has the second wire 20 and the dummy wire 21, and the insulating cover layer 7 that is provided on the insulating base layer 3 so as to cover the first conductive pattern 4.

Meanwhile, the wired circuit board 1 does not include the intermediate insulating layer 5 and the first conductive pattern 4.

The modified example also achieves the same operations and effects as those of the first to fifth embodiments.

As the wired circuit board of the present invention, the wired circuit board 1 is used. However, the wired circuit board of the present invention is not limited to this, and a suspension board with circuit including a metal supporting board 2 can be also used. In such a case, the suspension board with circuit includes the metal supporting board 2, the insulating base layer 3, the first conductive pattern 4, the intermediate insulating layer 5, the second conductive pattern 6, and the insulating cover layer 7.

The intermediate insulating layer 5 has the second flat face 16, but does not have to have the second flat face 16 as long as at least the inclination face 15 is included.

The above-described first to fifth embodiments can be suitably combined. For example, the second conductive pattern 6 can also include both of the dummy wire 21 (ref: FIG. 1) and the dummy portion 35 (ref: FIG. 15).

The intermediate insulating layer 5 can also include both of the bent portion 17 (ref: FIG. 1) and the inclination face 15 corresponding to the third linear portion 36.

EXAMPLES

The present invention will hereinafter be described based on Examples and Comparative Examples below. The present invention is however not limited by the following Examples and Comparative Examples. The specific numerical values in mixing ratio (content ratio), property value, and parameter used in the following description will be replaced with upper limits (numerical values defined as "or less" or "less than") or lower limits (numerical values defined as "or more" or "more than") of corresponding numerical values in mixing ratio (content ratio), property value, and parameter described in the above-described "DESCRIPTION OF EMBODIMENTS".

Example 1 (Example Corresponding to First Embodiment)

As shown in FIG. 3A, first, the insulating base layer 3 made of polyimide having a thickness of 10 μm was prepared (step (i)).

As shown in FIG. 3B, next, the first conductive pattern 4 made of copper was provided on the insulating base layer 3 (step (ii)). As shown in FIG. 1, the first conductive pattern 4 integrally includes the first arc portion 11 and the two first linear portions 12. The first conductive pattern 4 had a thickness of 9 μm and the width W1 of 20 μm. The virtual circle along the first arc portion 11 had the radius R1 of 50 μm. The central angle α of the first arc portion 11 was 90 degrees.

As shown in FIG. 3C, next, the intermediate insulating layer 5 made of polyimide was provided on the insulating base layer 3 so as to cover the first conductive pattern 4 (step (1)). The intermediate insulating layer 5 has the first flat face 14, the inclination face 15, and the second flat face 16. The inclination face 15 has the bent portion 17. The supplementary angle β to the angle β' formed with the bent portion 17 and the first flat face 14 was 30 degrees. The virtual circle along the bent portion 17 had the radius R2 of 40 μm.

As shown in FIG. 4D, next, the metal thin film 33 consisting of a chromium thin film having a thickness of 30 nm and a copper thin film having a thickness of 70 μm was provided on the intermediate insulating layer 5 by a sputtering method (step (2)).

As shown in FIG. 4E, next, the photoresist 25 having a thickness of 20 μm was provided on the metal thin film 33 (step (3)).

As shown in FIG. 4F, next, the photomask 24 was disposed so that the first portion 23 and the third portion 29 in the photoresist 25 were shielded from light (step (4)). To be specific, the photomask 24 was disposed so that the first light shield portion 31 faced the first portion 23, and the second light shield portion 32 faced the third portion 29.

As shown in the arrow of FIG. 4F, subsequently, the photoresist 25 was exposed to light thorough the photomask 24 (step (4)).

As shown in FIG. 5G, next, by developing, the first portion 23 and the third portion 29 in the photoresist 25 were removed, and the metal thin film 33 corresponding to the first portion 23 and the third portion 29 was exposed (step (5)).

As shown in FIG. 5H, next, by electrolytic copper plating in which electricity is supplied from the metal thin film 33, the second conductive pattern 6 was provided on the metal thin film 33 exposed from the photoresist 25 (step (6)). As shown FIG. 1, the second conductive pattern 6 includes the second wire 20, and the dummy wire 21 in an arc shape when viewed from the top that is independent from the second wire 20. The second conductive pattern 7 had a thickness of 9 μm. The second linear portion 22 had the width W2 of 10 μm. The dummy wire 21 had the width W3 of 20 μm. The virtual circle along the dummy wire 21 had the radius R3 of 35 μm. The central angle of the arc of the dummy wire 21 was 90 degrees.

As shown in FIG. 5I, next, the photoresist 25 was removed by etching (step (iii)).

As shown in FIG. 6J, next, the metal thin film 33 corresponding to the photoresist 25 was removed by peeling (step (iv)).

As shown in FIG. 6K, next, the insulating cover layer 7 made of polyimide having a thickness of 5 μm was provided on the intermediate insulating layer 5 so as to cover the second conductive pattern 6 (step (v)).

In this manner, a suspension board with circuit 1 was produced.

When the obtained suspension board with circuit 1 was observed, deformation such as breakage was not observed in the second wire 20.

Comparative Example 1 (Comparative Example Corresponding to Example 1)

The suspension board with circuit 1 was obtained in the same manner as that in Example 1, except that the dummy wire 21 was not provided in the second conductive pattern 6 (FIG. 7, FIG. 8A to FIG. 8C). That is, in the step (4), as shown in FIG. 8A, in the photomask 24, the light shield portion 27 does not have the second light shield portion 32 corresponding to the third portion 29 (ref: FIG. 4F), and has only the first light shield portion 31 corresponding to the first portion 23.

However, as shown in FIG. 8A, in the step (4), a light shielding failure of the first portion 23 caused by generation of the reflected light B' in the metal thin film 33 corresponding to the first portion 23 occurred; as shown in FIG. 8B, in the step (5), the first portion 23 could not be removed; and as shown in the solid line of FIG. 8C, at the center CP (ref: FIG. 7) and near the center CP, deformation of the second wire 20 occurred.

Example 2 (Example Corresponding to Fourth Embodiment)

As shown in FIG. 3A, first, the insulating base layer 3 made of polyimide having a thickness of 10 μm was prepared (step (i)).

As shown in FIG. 3B, next, the first conductive pattern 4 made of copper was provided on the insulating base layer 3 (step (ii)). As shown in FIG. 15, the first conductive pattern 4 integrally includes the two first linear portions 12, the third linear portion 36, and the second connecting portion 37 connecting the first linear portions 12 and the third linear portion 36. The first conductive pattern 4 had a thickness of 9 μm and the width W1 of 20 μm.

As shown in FIG. 3C, next, the intermediate insulating layer 5 made of polyimide was provided on the insulating base layer 3 so as to cover the first conductive pattern 4 (step (1)). The intermediate insulating layer 5 has the first flat face 14, the inclination face 15, and the second flat face 16. The angle β formed with the inclination face 15 and the first flat face 14 was 30 degrees.

As shown in FIG. 4D, next, the metal thin film 33 consisting of a chromium thin film having a thickness of 30 nm and a copper thin film having a thickness of 70 μm was provided on the intermediate insulating layer 5 by a sputtering method (step (2)).

As shown in FIGS. 16A and 17A, next, the photoresist 25 having a thickness of 20 μm was provided on the metal thin film 33 (step (3)).

Next, the photomask 24 was disposed so that the first portion 23 and the third portion 29 in the photoresist 25 were shielded from light (step (4)). To be specific, the photomask 24 was disposed so that the first light shield portion 31 faced the first portion 23, and the second light shield portion 32 faced the third portion 29.

As shown in the arrow of FIG. 16A and FIG. 17A, subsequently, the photoresist 25 was exposed to light thorough the photomask 24 (step (4)).

As shown in FIGS. 16B and 17B, next, by developing, the first portion 23 and the third portion 29 in the photoresist 25 were removed, and the metal thin film 33 corresponding to the first portion 23 and the third portion 29 was exposed (step (5)).

Next, by electrolytic copper plating in which electricity is supplied from the metal thin film 33, the second conductive pattern 6 was provided on the metal thin film 33 exposed from the photoresist 25 (step (6)). The second conductive pattern 6 includes the second wire 20 and the dummy wire 21 that is independent from the second wire 20. The second conductive pattern 6 had a thickness of 9 μm. The second linear portion 22 had the width W2 of 7.5 μm. The dummy wire 21 had the width W3 of 20 μm. When viewed from the top, the distance (interval) L1 between the third linear portion 36 and the second linear portion 22 in the width direction was 20 μm. The distance L2 between the inclination face 15 and the second linear portion 22 was 17.5 μm. The length (=L2−L1) obtained by subtracting the distance L1 from the distance L2 was 2.5 μm.

Next, as shown in FIG. 5I, the photoresist 25 was removed by etching (step (iii)).

Next, as shown in FIG. 6J, the metal thin film 33 corresponding to the photoresist 25 was removed by peeling (step (iv)).

As shown in FIG. 16C and FIG. 17C, next, the insulating cover layer 7 made of polyimide having a thickness of 5 μm was provided on the intermediate insulating layer 5 so as to cover the second conductive pattern 6 (step (v)).

In this manner, the wired circuit board 1 was produced.

When the obtained wired circuit board 1 was observed, deformation such as breakage was not observed in the second wire 20.

Comparative Example 2 (Comparative Example Corresponding to Example 2)

The wired circuit board 1 was obtained in the same manner as that in Example 2, except that the dummy wire 21 was not provided in the second conductive pattern 6.

In the second conductive pattern 6, deformation such as breakage was observed.

Example 3 to Example 9

The wired circuit board 1 was obtained in the same manner as that in Example 2, except that the above-described W2 and L2 (and L1) were changed according to the descriptions in Table 1 to Table 4. In Example 3 to Example 9, in the second wire 20, deformation such as breakage was not observed.

Comparative Example 2 to Comparative Example 16

The wired circuit board 1 was obtained in the same manner as that in Example 2, except that the above-described W2 and L2 (and L1) were changed according to the descriptions in Table 1 to Table 4, and furthermore, the dummy wire 21 was not provided in the second conductive pattern 6.

In the second wire 20, evaluation of the shape such as breakage was described in Table 1 to Table 4.

TABLE 1

| | Presence or Absence of Dummy Wire | Width W2 of Second Wire (μm) | Distance L2 between Inclination Face Corresponding to Third Linear Portion and Second Linear Portion (μm) | Formula (1) *1 | Distance L1 between Third Linear Portion and Second Linear Portion (μm) | Formula (2) *2 | Evaluation of Breakage |
|---|---|---|---|---|---|---|---|
| Comp. Ex. 2 | — | 7.5 | 22.5 | unsatisfactory | 25 | unsatisfactory | Good |
| Comp. Ex. 3 | — | 7.5 | 17.5 | satisfactory | 20 | satisfactory | Bad |
| Ex. 2 | Dummy Wire | 7.5 | 17.5 | satisfactory | 20 | satisfactory | Good |
| Comp. Ex. 4 | — | 7.5 | 12.5 | satisfactory | 15 | satisfactory | Bad |
| Ex. 3 | Dummy Wire | 7.5 | 12.5 | satisfactory | 15 | satisfactory | Good |
| Comp. Ex. 5 | — | 7.5 | 7.5 | satisfactory | 10 | satisfactory | Bad |
| Ex. 4 | Dummy Wire | 7.5 | 7.5 | satisfactory | 10 | satisfactory | Good |
| Comp. Ex. 6 | — | 7.5 | 2.5 | satisfactory | 5 | satisfactory | Bad |
| Ex. 5 | Dummy Wire | 7.5 | 2.5 | satisfactory | 5 | satisfactory | Good |

*1 $L2 \leq -2 \times W + 37.5$
*2 $L2 \leq -2 \times W + 35$

TABLE 2

| | Presence or Absence of Dummy Wire | Width W2 of Second Wire (μm) | Distance L2 between Inclination Face Corresponding to Third Linear Portion and Second Linear Portion (μm) | Formula (1) *1 | Distance L1 between Third Linear Portion and Second Linear Portion (μm) | Formula (2) *2 | Evaluation of Breakage |
|---|---|---|---|---|---|---|---|
| Comp. Ex. 7 | — | 10 | 22.5 | unsatisfactory | 25 | unsatisfactory | Good |
| Comp. Ex. 8 | — | 10 | 17.5 | unsatisfactory | 20 | unsatisfactory | Good |
| Comp. Ex. 9 | — | 10 | 12.5 | satisfactory | 15 | satisfactory | Bad |
| Ex. 6 | Dummy Wire | 10 | 12.5 | satisfactory | 15 | satisfactory | Good |
| Comp. Ex. 10 | — | 10 | 7.5 | satisfactory | 10 | satisfactory | Bad |
| Ex. 7 | Dummy Wire | 10 | 7.5 | satisfactory | 10 | satisfactory | Good |
| Comp. Ex. 11 | — | 10 | 2.5 | satisfactory | 5 | satisfactory | Bad |
| Ex. 8 | Dummy Wire | 10 | 2.5 | satisfactory | 5 | satisfactory | Good |

*1 $L2 \leq -2 \times W + 37.5$
*2 $L2 \leq -2 \times W + 35$

TABLE 3

| | Presence or Absence of Dummy Wire | Width W2 of Second Wire (μm) | Distance L2 between Inclination Face Corresponding to Third Linear Portion and Second Linear Portion (μm) | Formula (1) *1 | Distance L1 between Third Linear Portion and Second Linear Portion (μm) | Formula (2) *2 | Evaluation of Breakage |
|---|---|---|---|---|---|---|---|
| Comp. Ex. 12 | — | 15 | 12.5 | unsatisfactory | 15 | unsatisfactory | Good |
| Comp. Ex. 13 | — | 15 | 7.5 | unsatisfactory | 10 | unsatisfactory | Good |

TABLE 3-continued

| | Presence or Absence of Dummy Wire | Width W2 of Second Wire (μm) | Distance L2 between Inclination Face Corresponding to Third Linear Portion and Second Linear Portion (μm) | Formula (1) *1 | Distance L1 between Third Linear Portion and Second Linear Portion (μm) | Formula (2) *2 | Evaluation of Breakage |
|---|---|---|---|---|---|---|---|
| Comp. Ex. 14 | — | 15 | 2.5 | satisfactory | 5 | satisfactory | Good |
| Ex. 9 | Dummy Wire | 15 | 2.5 | satisfactory | 5 | satisfactory | Good |

*1 L2 ≤ −2 × W + 37.5
*2 L2 ≤ −2 × W + 35

TABLE 4

| | Presence or Absence of Dummy Wire | Width W2 of Second Wire (μm) | Distance L2 between Inclination Face Corresponding to Third Linear Portion and Second Linear Portion (μm) | Formula (1) *1 | Distance L1 between Third Linear Portion and Second Linear Portion (μm) | Formula (2) *2 | Evaluation of Breakage |
|---|---|---|---|---|---|---|---|
| Comp. Ex. 15 | — | 20 | 7.5 | unsatisfactory | 10 | unsatisfactory | Good |
| Comp. Ex. 16 | — | 20 | 2.5 | unsatisfactory | 5 | unsatisfactory | Good |

*1 L2 ≤ −2 × W + 37.5
*2 L2 ≤ −2 × W + 35

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a wired circuit board including an insulating layer and a conductive pattern, the method comprising the steps of:
   a step (1), in which the insulating layer having an inclination face is provided;
   a step (2), in which a metal thin film is provided at least on the surface of the insulating layer;
   a step (3), in which a photoresist is provided on the surface of the metal thin film;
   a step (4), in which a photomask is disposed so that a first portion of the photoresist, where the conductive pattern is to be provided in the photoresist, is shielded from light, and the photoresist is exposed to light through the photomask;
   a step (5), in which the first portion of the photoresist is removed to expose the metal thin film corresponding to the first portion of the photoresist that has been removed; and
   a step (6), in which the conductive pattern is provided on the surface of the metal thin film exposed from the first portion of the photoresist that has been removed,
   wherein the inclination face has a second portion that allows the reflected light reflected at the metal thin film to reach the first portion of the photoresist,
   in the step (4), the photomask is disposed so that the photoresist facing the second portion is shielded from light,
   the second portion has an arc-shaped bent portion continuously bending in one direction when viewed from the top, and
   the arc-shaped bent portion is made so that the reflected light corresponding to the arc-shaped bent portion is focused on the first portion of the photoresist.

2. The method for producing a wired circuit board according to claim 1, wherein
   the conductive pattern has a wire having a width W of 15 μm or less,
   the first portion corresponding to the wire is disposed at an interval L of 20 μm or less relative to the second portion when viewed from the top, and
   the width W (μm) and the interval L (μm) satisfy the following formula (1):

$$L \leq -2 \times W + 35 \qquad (1).$$

3. The method for producing a wired circuit board according to claim 1, wherein
   the conductive pattern has a wire and a dummy wire provided independently from the wire, and
   in the step (4), a third portion, where the dummy wire is to be provided in the photoresist, is overlapped with the second portion when viewed from the top.

4. The method for producing a wired circuit board according to claim 1, wherein
   the conductive pattern has a wire and a dummy portion provided continuously from the wire, and
   in the step (4), a third portion, where the dummy portion is to be provided in the photoresist, is overlapped with the second portion when viewed from the top.

5. A method for producing a wired circuit board including an insulating layer and a conductive pattern, the method comprising the steps of:
   a step (1), in which the insulating layer having an inclination face is provided;

a step (2), in which a conductive layer is provided at least on the surface of the insulating layer;

a step (3), in which a photoresist is provided on the surface of the conductive layer;

a step (4), in which a photomask is disposed so that a first portion of the photoresist, where the conductive pattern is to be provided in the photoresist, is shielded from light, and the photoresist is exposed to light through the photomask;

a step (5), in which the photoresist other than the first portion of the photoresist is removed so as to leave the first portion of the photoresist and so as to expose the conductive layer; and a step (6), in which the conductive layer exposed with respect to the first portion of the photoresist is removed to form the conductive pattern;

wherein the inclination face has a second portion that allows the reflected light reflected at the conductive layer to reach the first portion of the photoresist, in the step (4), the photomask is disposed so that the photoresist facing the second portion is shielded from light, the second portion has an arc-shaped bent portion continuously bending in one direction when viewed from the top, and the arc-shaped bent portion is made so that the reflected light corresponding to the arc-shaped bent portion is focused on the first portion of the photoresist.

6. The method for producing a wired circuit board according to claim 5, wherein the conductive pattern has a wire having a width W of 15 μm or less, the first portion corresponding to the wire is disposed at an interval L of 20 μm or less relative to the second portion when viewed from the top, and the width W (μm) and the interval L (μm) satisfy the following formula (1):

$$L \leq -2 \times W + 35 \qquad (1).$$

7. The method for producing a wired circuit board according to claim 5, wherein the conductive pattern has a wire and a dummy wire provided independently from the wire, and in the step (4), a third portion, where the dummy wire is to be provided in the photoresist, is overlapped with the second portion when viewed from the top.

8. The method for producing a wired circuit board according to claim 5, wherein the conductive pattern has a wire and a dummy portion provided continuously from the wire, and in the step (4), a third portion, where the dummy portion is to be provided in the photoresist, is overlapped with the second portion when viewed from the top.

* * * * *